(12) United States Patent
Shirasaka et al.

(10) Patent No.: US 7,727,793 B2
(45) Date of Patent: Jun. 1, 2010

(54) PHYSICAL QUANTITY SENSOR AND MANUFACTURING METHOD THEREFOR

(75) Inventors: Kenichi Shirasaka, Hamamatsu (JP); Hiroshi Saitoh, Iwata-gun (JP)

(73) Assignee: Yamaha Corporation, Shizuoka-ken (JP)

( * ) Notice: Subject to any disclaimer, the term of this patent is extended or adjusted under 35 U.S.C. 154(b) by 400 days.

(21) Appl. No.: 11/543,034

(22) Filed: Oct. 5, 2006

(65) Prior Publication Data

US 2007/0028685 A1 Feb. 8, 2007

Related U.S. Application Data

(62) Division of application No. 11/244,194, filed on Oct. 6, 2005, now Pat. No. 7,595,548.

(30) Foreign Application Priority Data

| Oct. 8, 2004 | (JP) | ............................ P2004-296371 |
| Feb. 22, 2005 | (JP) | ............................ P2005-045299 |
| Mar. 25, 2005 | (JP) | ............................ 2005-089629 |
| Mar. 29, 2005 | (JP) | ............................ 2005-094388 |

(51) Int. Cl.
*H01L 21/58* (2006.01)

(52) U.S. Cl. ........................ 438/67; 438/108; 438/124; 257/E21.504

(58) Field of Classification Search .................. 438/67, 438/108, 124, FOR. 379; 257/E21.504
See application file for complete search history.

(56) References Cited

U.S. PATENT DOCUMENTS 5,450,283 A * 9/1995 Lin et al. .................... 361/704

(Continued)

FOREIGN PATENT DOCUMENTS

| CN | 1490632 | 4/2004 |
| JP | 63-121443 | 5/1988 |
| JP | 07-226475 | 8/1995 |
| JP | 09-292408 | 11/1997 |

(Continued)

*Primary Examiner*—George Fourson
(74) *Attorney, Agent, or Firm*—Dickstein Shapiro LLP

(57) ABSTRACT

A physical quantity sensor includes a pair of physical quantity sensor chips that are inclined with respect to the bottom of an exterior mold package whose side surfaces are each inclined in a thickness direction by an angle ranging from 0° to 5° and are formed in proximity to the outer ends of the physical quantity sensor chips. It is possible to realize the inclination of stages without using molds, wherein absorption devices are used to absorb prescribed portions related to stages, which rotate about axial lines and are thus inclined with respect to a prescribed base. In manufacturing, a thin metal plate having a plurality of lead frames is placed on a base delimited by a clamp; then, intersecting points of intermediate portions formed between the lead frames are subjected to pressing so as to realize the inclination of stages.

17 Claims, 27 Drawing Sheets

U.S. PATENT DOCUMENTS

| | | | |
|---|---|---|---|
| 5,866,818 A | 2/1999 | Sumi et al. | |
| 5,872,395 A * | 2/1999 | Fujimoto | 257/675 |
| 6,081,978 A * | 7/2000 | Utsumi et al. | 29/25.01 |
| 6,146,919 A * | 11/2000 | Tandy | 438/106 |
| 6,596,561 B2 * | 7/2003 | Takahashi et al. | 438/113 |
| 6,830,955 B2 * | 12/2004 | Shin et al. | 438/106 |
| 2003/0052418 A1 * | 3/2003 | Yasuda | 257/787 |
| 2006/0042382 A1 | 3/2006 | DCamp et al. | |

FOREIGN PATENT DOCUMENTS

| | | |
|---|---|---|
| JP | 2000-124239 | 4/2000 |
| JP | 2000-164949 | 6/2000 |
| JP | 2002-156204 | 5/2002 |
| JP | 2002-343817 | 11/2002 |
| JP | 2004-125779 A | 4/2004 |
| JP | 2004-128472 | 4/2004 |
| JP | 2004-128473 | 4/2004 |

* cited by examiner

PHYSICAL QUANTITY SENSOR AND MANUFACTURING METHOD THEREFOR

CROSS REFERENCE TO RELATED APPLICATIONS

This application is a Divisional of application Ser. No. 11/244,194, filed Oct. 6, 2005, entitled PHYSICAL QUANTITY SENSOR AND MANUFACTURING METHOD THEREFOR, the entire disclosure of which is incorporated herein by reference.

BACKGROUND OF THE INVENTION

1. Field of the Invention

The present invention relates to physical quantity sensors that measure bearings and directions regarding physical quantities such as magnetism and gravitation. The present invention also relates to manufacturing methods of physical quantity sensors.

This application claims priorities on Japanese Patent Applications Nos. 2004-296371, 2005-45299, 2005-89629, and 2005-94388, the contents of which are incorporated herein by reference.

2. Description of the Related Art

Recently, sensing technologies regarding measurement of bearings and directions in a three-dimensional space have been developed to provide various types of physical quantity sensors, such as magnetic sensors and acceleration sensors, which detect physical quantities such as magnetism and acceleration. For example, Japanese Unexamined Patent Application Publication No. 2004-128473 discloses an example of a magnetic sensor using a specially-designed lead frame.

It is known that physical quantity sensors are each equipped with physical quantity sensor chips (or magnetic sensor chips) which are mutually inclined with respect to each other. Due to the mutual inclination of paired physical quantity sensor chips, it is possible to detect magnetic factors lying in three directions (e.g., X-axis and Y-axis directions that are perpendicular to each other on the plane, as well as a Z-axis direction perpendicular to the X-axis and Y-axis directions); hence, it is possible to measure the direction of geomagnetism based on detected values as vectors existing in a three-dimensional space. Thus, it is possible to reduce the overall thickness of physical quantity sensors.

In addition to the aforementioned advantage in which physical quantity sensors each having mutually inclined physical quantity sensor chips can be reduced in the overall thickness thereof, it is possible to provide the following advantages.

For example, Japanese Unexamined Patent Application Publication No. H09-292408 teaches an example of an acceleration sensor, i.e., a physical quantity sensor of a one-sided beam structure in which a physical quantity sensor chip (i.e., an acceleration sensor chip) is inclined in advance with respect to a substrate therefor.

In the above, even when a sensor package is mounted on the surface of the substrate, it is possible to maintain a sensitivity in a prescribed axial direction in response to the inclination direction of the physical quantity sensor chip; and it is possible to reduce sensitivities in other axial directions including directions lying along the surface of the substrate. As a result, it is possible to maintain prescribed product characteristics in shipment.

Specifically, FIG. 17 shows a known structure of a physical quantity sensor 100 having an exterior mold portion 101 for fixing a pair of magnetic sensor chips 103, which are inclined with respect to each other, onto a bottom 102. The exterior mold portion 101 is molded using a resin. For this reason, side surfaces 105 of the exterior mold portion 101 generally have slopes that are each inclined in a thickness direction H by predetermined angles.

The aforementioned physical quantity sensor 100 can be adapted to a portable terminal device such as a portable telephone (or a cellular phone) having a navigation function, for example. Due to the recent tendency in which portable terminal devices have been reduced in dimensions, there may be a demand for the aforementioned physical quantity sensor 100 to be further reduced in dimensions. In order to realize compactness of the physical quantity sensor 100, it may be necessary to reduce dimensions G lying in a length direction W of the bottom 102 to as small as possible.

However, due to the slopes having prescribed angles adapted to the side surfaces 105 of the physical quantity sensor 100, both ends of the bottom 102 lying in the length direction W must be greatly projected outwardly beyond terminal ends 104 of the physical quantity sensor chips 103. This causes a bottleneck making it difficult further reduce dimensions of the physical quantity sensor 100.

Recently, portable terminal devices such as portable telephones (or cellular phones) have been equipped with GPS (Global Positioning System) functions for displaying users' present locations on earth. In addition, portable terminal devices can be further developed to have functions for precisely measuring geomagnetism and acceleration in addition to GPS functions; hence, it is possible for portable terminal devices held by users to measure bearings and directions thereof in a three-dimensional space as well as moving directions thereof.

In order to realize the aforementioned functions in portable terminal devices, it is necessary to incorporate physical quantity sensors such as magnetic sensors and acceleration sensors. In order to measure bearings and acceleration in a three-dimensional space, it is necessary that stages facilitating physical quantity sensor chips be inclined with respect to prescribed bases.

For example, one type of known magnetic sensor presently sold on the market is designed such that stages facilitating physical quantity sensor chips are not necessarily inclined with respect to prescribed bases. In this type of physical quantity sensor, there are provided a first magnetic sensor chip sensitive to magnetic factors lying in two directions (i.e., X-axis and Y-axis directions perpendicular to each other) of an external magnetic field and a second magnetic sensor chip sensitive to a magnetic factor lying in another direction (i.e., a Z-axis direction), wherein both the first and second magnetic sensor chips are mounted on the surface of a substrate.

The aforementioned magnetic sensor measures geomagnetic factors as vectors in a three-dimensional space based on magnetic factors detected by a pair of the first and second magnetic sensor chips.

However, the aforementioned magnetic sensor is basically designed such that the second magnetic sensor chip vertically stands on the surface of the substrate; hence, it is disadvantageous in that the thickness thereof (lying in the Z-axis direction) must be increased. In order to minimize the thickness, it is necessary to use physical quantity sensors in which stages facilitating physical quantity sensor chips are inclined with respect to prescribed bases. Examples have been disclosed in various papers such as Japanese Unexamined Patent Application Publications Nos. 2004-128473 and H09-292408, which have already been discussed above. In addition, Japanese Unexamined Patent Application Publication No. 2002-156204 discloses a magnetic sensor and an angle sensor having reduced dimensions.

As described above, a plurality of physical quantity sensor chips are mutually inclined with respect to each other inside of the physical quantity sensor, whereby it is possible to detect magnetic factors in three directions (i.e., X-axis, Y-axis, and Z-axis directions); hence, it is possible to measure the geomagnetic direction as vectors in a three-dimensional space on the basis of detection results. Due to the mutual inclination of physical quantity sensor chips, it is possible to reduce the height in the Z-axis direction; in other words, it is possible to minimize the thickness of the magnetic sensor.

In the above, it is required that an angle formed between two stages facilitating two magnetic sensor chips ranges from 0° to 90°. It is preferable that the angle be greater than 20°; and it is further preferable that the angle be greater than 30°. This is because a larger angle may improve the sensitivity lying in the Z-axis direction, which is well isolated from the X-axis and Y-axis directions.

As described above, physical quantity sensors in which physical quantity sensor chips are mutually inclined with respect to each other are advantageous in that the thickness thereof can be minimized so as to cope with downsizing of electronic devices, wherein they have various advantages due to the mutual inclination of physical quantity sensor chips and thus will contribute to mainstream technologies in the future.

An example of a physical quantity sensor in which physical quantity sensor chips are mutually inclined with respect to each other will be described with reference to FIG. 18. Physical quantity sensor chips are mounted on stages of a lead frame encapsulated in a resin mold package, wherein they are supported in a mutually inclined state by projections which project downwardly from stages towards the bottom of the resin mold package.

In manufacturing, a thin metal plate is subjected to press working so as to form the lead frame having the stages; then, projections are formed to project from the opposite ends of the lower surfaces (or back sides) of the stages. The lead frame is held and fixed in a pair of metal molds realizing a cavity of a prescribed shape therebetween, wherein the tip ends of the projections are pressed by the interior wall of the lower metal mold, so that the stages are rotated about axial lines relative to interconnection portions which are interconnected to the bases of the stages, and are thus appropriately bent; hence, the lead frame including the stages and projections is processed as shown in FIG. 18. Thereafter, a resin is introduced into the cavity of the metal molds. Thus, the opposite ends of the stages are respectively directed towards the upper surface of the resin mold package, whereby the stages are supported by the projections in a mutually inclined state.

In the aforementioned manufacturing method, the projections are subjected to pressing using a pair of metal molds, which are therefore likely to be damaged. In addition, it may require a troublesome work to precisely incline the stages by pressing.

As the stages of the lead frame are subjected to inclination using the upper and lower molds by way of the projections, which project from the stages, the physical quantity sensor has a drawback in that the overall size of the package encapsulating the lead frame and physical quantity sensor chips is increased due to the provision of the projections.

SUMMARY OF THE INVENTION

It is an object of the present invention to provide a physical quantity sensor and a manufacturing method therefor, in which the physical quantity sensor is downsized with a simple structure.

It is another object of the present invention to provide a manufacturing method for a physical quantity sensor without using metal molds, which are used to hold a lead frame therebetween. Even though metal molds are used in manufacturing, the present invention makes it possible to improve the durability of metal molds. In addition, the present invention makes it possible to quickly and easily manufacture physical quantity sensors.

It is a further object of the present invention to provide a manufacturing method for a physical quantity sensor, which can be reduced in size and which can be smoothly produced with a reduced cost.

In a first aspect of the present invention, a physical quantity sensor is constituted using a pair of physical quantity sensor chips encapsulated in an exterior mold package, which is molded using a resin, wherein the physical quantity sensor chips are inclined with respect to the bottom of the exterior mold package, and wherein the side surfaces of the exterior mold package are each inclined inwardly in a thickness direction by an angle, which ranges from 0° to 5°, and are formed in proximity to outer ends of the physical quantity sensor chips, which are arranged opposite to each other.

By increasing the angle with regard to the side surfaces of the exterior mold package that are broadened outwardly, it is possible to reduce the length of the bottom of the exterior mold package, whereby it is possible to reduce the overall area of the bottom of the exterior mold package. This realizes downsizing of the physical quantity sensor.

In the above, a plurality of leads are formed and are electrically connected to the physical quantity sensor chips in such a way that the leads partially overlap with the physical quantity sensor chips in the thickness direction. This contributes to a further reduction of the length of the bottom of the exterior mold package; hence, it is possible to realize downsizing of the physical quantity sensor.

In addition, the lead has an inclination portion, which is inclined with respect to the bottom of the exterior mold package and on which the physical quantity sensor chips are arranged. This makes it easy for the physical quantity sensor chip to be inclined without coming in contact with the leads.

In a manufacturing method for a physical quantity sensor in which a pair of physical quantity sensor chips are incorporated into an exterior mold package, which is molded using a resin, and are each inclined with respect to the bottom of the exterior mold package, wherein a bonding step is performed such that the physical quantity sensor chips are bonded onto stages of a lead frame, which is formed by processing a thin metal plate, a connection step is performed such that an electric connection is established between the lead frame and the physical quantity sensor chips; a fixing step is performed such that the lead frame equipped with the physical quantity sensor chips is fixed into a cavity of a metal mold; and a molding step is performed such that a resin is injected into the cavity of the metal mold holding the lead frame and the physical quantity sensor chips, thus forming the exterior mold package, wherein side surfaces of the exterior mold package are each inclined in a thickness direction by an angle, which ranges from 0° to 5°, and are formed in proximity to outer ends of the physical quantity sensor chips.

In the above, it is possible to introduce a dicing step in which by setting the angle to zero, the lead frame and the exterior mold package are subjected to dicing so that the side surfaces of the exterior mold package are formed in proximity to the outer ends of the physical quantity sensor chips. This eliminates the necessity of arranging extraction slopes in the side surfaces of the exterior mold package; hence, it is possible to realize downsizing of the physical quantity sensor with a simple structure.

In a second aspect of the present invention, there is provided a manufacturing method for a physical quantity sensor using a lead frame having a plurality of stages, a frame portion having a plurality of leads that are formed to encompass the stages, and a plurality of interconnection portions for interconnecting prescribed ends of the stages to the frame portion, wherein a bonding step is performed such that a plurality of physical quantity sensor chips are bonded onto the stages of the lead frame; a connection step is performed such that the leads are electrically connected to the physical quantity sensor chips; an installation step is performed such that the lead frame is placed onto a planar surface of a base; and an inclination step is performed such that prescribed portions related to the stages of the lead frame are subjected to absorption onto the base, wherein due to absorption, the stages mutually rotate about axial lines while the interconnection portions are being bent, so that the stages are inclined with respect to the frame portion. This removes metal molds used to hold the lead frame, wherein the stages can be easily inclined.

In the above, a plurality of lead frames are formed in a single sheet of a thin metal plate. Herein, the installation step is performed such that the periphery of the thin metal plate having the frame portion encompassing a plurality of lead frames are fixed by means of a clamp that vertically stands on the planar plane of the base; a molding step is performed such that a resin is introduced into a space holding the thin metal plate, which is defined by the planar plane and the clamp, so as to simultaneously mold exterior mold packages respectively encapsulating the lead frames; and a dicing step is performed such that the frame portion is subjected to dicing so as to isolate individual units of the exterior mold packages. This eliminates the necessity of using extraction slopes in the exterior mold packages; hence, it is possible to reduce the bottom area of the exterior resin package; thus, it is possible to realize downsizing of a magnetic sensor.

In addition, a plurality of projections are formed so as to project downwardly from the stages, so that due to absorption of the prescribed portions, which match a lower surface of the frame portion in proximity to the stages, the projections are subjected to pressing so that prescribed ends of the stages are pressed upwardly. This makes it easy for the stages to rotate about axial lines passing through the interconnection portions, so that the prescribed ends of the stages are lifted up; thus, the stages are inclined with respect to the frame portion.

Alternatively, the stages are lifted upwards from the frame portion with prescribed offset values, so that due to absorption of the prescribed portions, prescribed ends of the stages are lowered downwards.

Alternatively, a plurality of inclination portions are each extended upwardly from the stages in a slanted manner, so that the inclination portions are subjected to absorption and are lowered so as to lift up prescribed ends of the stages.

As described above, it is possible to incline the stages with respect to the frame portion with ease without using metal molds to hold the lead frame, whereby it is possible to manufacture a magnetic sensor in a short period of time. Even though the upper and lower metal molds are used to hold the lead frame, they do not necessarily press the prescribed portions of the lead frame; hence, it is possible to prevent the metal molds from being damaged; thus, it is possible to improve the durability of the metal molds.

In a third aspect of the present invention, there is provided a manufacturing method for a physical quantity sensor using a lead frame that includes a plurality of stages for mounting physical quantity sensor chips thereon, a frame portion having a plurality of leads encompassing the stages, and a plurality of interconnection portions for interconnecting prescribed ends of the stages to the frame portion, wherein a frame forming step is performed such that a plurality of lead frames are formed in a thin metal plate; a bonding step is performed such that the physical quantity sensor chips are bonded onto the stages in each of the lead frames; a connection step is performed such that the leads are electrically connected to the physical quantity sensor chips; an installation-fixation step is performed such that the thin metal plate is placed on a planar surface of a base, on which the periphery of the thin metal plate is clamped using a clamp, which vertically stands on the planar surface of the base; an inclination step is performed such that prescribed portions of the thin metal plate formed in proximity to the stages are subjected to pressing in a direction perpendicular to the planar surface so as to incline the stages with respect to the frame portion while the interconnection portions are being bent about axial lines; a molding step is performed such that a resin is introduced into a space defined by the clamp and the planar surface of the base so as to mold a package encapsulating the lead frame in which the stages are mutually inclined with respect to each other; and a dicing step is performed such that the frame portion and the package are subjected to dicing. This realizes the inclination of the stages without using projections, which project from the stages.

In the above, pressing pins are used to press the prescribed portions formed in proximity to the stages in the direction perpendicular to the planar surface so as to incline the stages with respect to the frame portion. This makes it possible to reliably incline the stages with a simple structure.

In addition, the prescribed portions formed in proximity to the stages are subjected to absorption in the direction towards the planar surface, wherein projections projecting from the stages are subjected to pressing by the planar plane due to absorption, so that the opposite ends of the stages are moved oppositely to the planar plane, thus inclining the stages with respect to each other. When the projections are pressed by the planar plane, the stages rotate about axial lines relatively to the interconnection portions; hence, the opposite ends of the stages are moved oppositely to the planar plane, thus realizing the inclination of the stages.

Alternatively, the prescribed portions formed in proximity to the stages are subjected to absorption in the direction towards the planar plane, wherein the stages are initially positioned apart from the planar plane of the base with prescribed offset values, so that the opposite ends of the stages are moved towards the planar plane due to absorption, thus inclining the stages with respect to each other.

Alternatively, the prescribed portions formed in proximity to the stages are subjected to absorption in the direction towards the planar plane, wherein inclination portions extending from the stages are inclined due to absorption, thus inclining the stages with respect to each other.

As described above, the stages can be easily inclined with respect to each other without using the projections. This makes it possible to downsize the physical quantity sensor; hence, it is possible to speedily produce the physical quantity sensor with a reduced cost.

BRIEF DESCRIPTION OF THE DRAWINGS

These and other objects, aspects, and embodiments of the present invention will be described in more detail with reference to the following drawings, in which:

FIG. 16 is a perspective view showing a lead frame realizing a plurality of magnetic sensors in accordance with a fifth modification of the first embodiment;

DESCRIPTION OF THE PREFERRED EMBODIMENTS

The present invention will be described in further detail by way of examples with reference to the accompanying drawings.

1. First Embodiment

Figure 1:
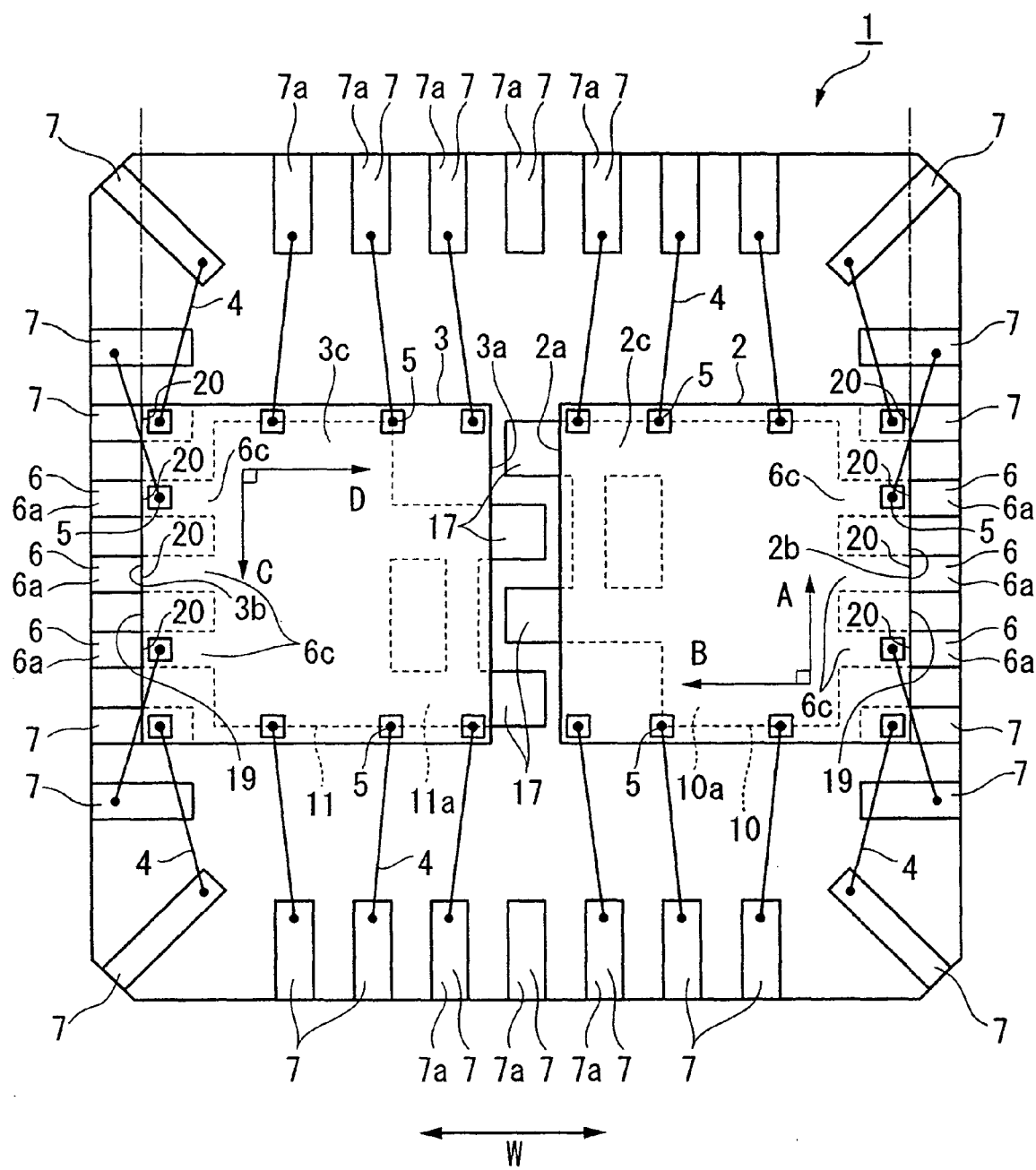
FIG. 1 is a plan view showing the overall structure of a magnetic sensor that is a physical quantity sensor in accordance with a first embodiment of the present invention.
Figure 2:
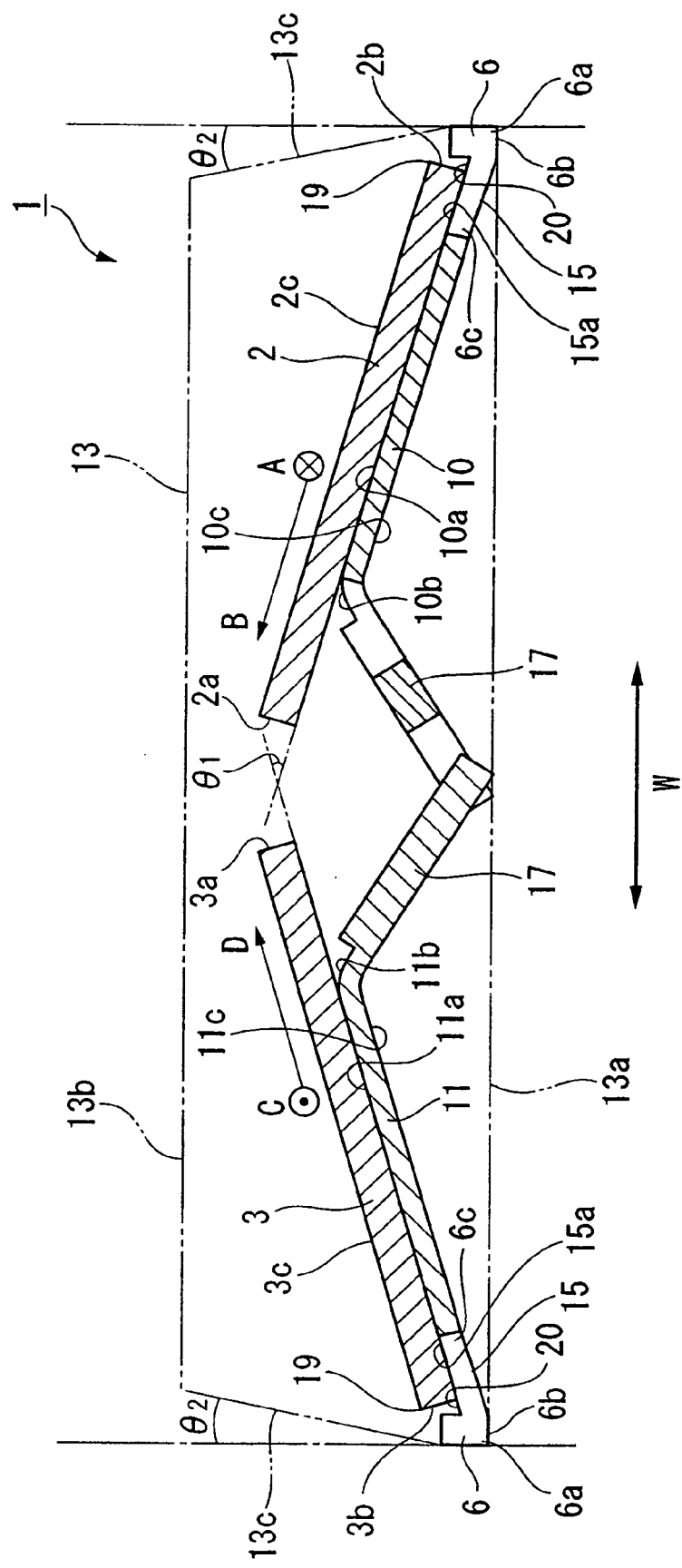
FIG. 2 is a cross-sectional view showing essential parts of the magnetic senor.

FIGS. 1 and 2 show a magnetic sensor 1 in accordance with a first embodiment of the present invention.

The magnetic sensor 1 is designed to measure the magnitude and direction of an external magnetic field, wherein it includes an exterior mold package 13, which is molded using a resin, as well as a first magnetic sensor chip 2 and a second magnetic sensor chip 3, both of which are incorporated in the exterior mold package 13.

Each of the magnetic sensor chips 2 and 3 has a rectangular plate-like shape in plan view, wherein they are respectively mounted on a first stage 10 and a second stage 11, which adjoin each other in a length direction W of the magnetic sensor 1. The magnetic sensor chips 2 and 3 are respectively inclined with respect to a bottom 13a of the exterior mold package 13. Specifically, the stages 10 and 11 are respectively inclined with respect to the bottom 13a by way of projections 17 therefor; hence, inner ends 2a and 3a of the magnetic sensor chips 2 and 3, which directly face each other, are respectively inclined towards a top 13b of the exterior mold package 13, while outer ends 2b and 3b of the magnetic sensor chips 2 and 3, which are opposite to the inner ends 2a and 3a, are respectively inclined towards the bottom 13a of the exterior mold package 13.

The first magnetic sensor chip 2 is sensitive to magnetic factors lying in two directions of an external magnetic field. That is, it has two sensing directions corresponding to directions A and B, which cross at a right angle along a surface 2c of the first magnetic sensor chip 2.

The second magnetic sensor chip 3 is sensitive to magnetic factors lying in two direction of an external magnetic field. That is, it has two sensing direction corresponding to directions C and D, which cross at a right angle along a surface 3c of the second magnetic sensor chip 3.

In the above, the directions A and C are perpendicular to the length direction W and are opposite each other. In addition, the directions B and D lie along the length direction W and are opposite each other.

In addition, a plane (referred to as an A-B plane) is defined by the directions A and B along the surface 2c of the first magnetic sensor chip 2; and a plane (referred to as a C-D plane) is defined by the directions C and D along the surface 3c of the second magnetic sensor chip 3. Herein, the A-B plane and the C-D plane cross so as to form an acute angle therebetween; that is, an angle $\theta_1$ between the A-B plane and the C-D plane is greater than 0° and is less than 90°. Theoretically, the magnetic sensor 1 can measure a bearing of geomagnetism in a three-dimensional space as long as the angle $\theta_1$ is greater than 0°. Actually, it is preferable that the angle $\theta_1$ be greater than 20°; and it is further preferable that the angle $\theta_1$ be greater than 30°.

A plurality of leads 6, which are integrally formed together with the stages 10 and 11, are arranged in proximity to the outer ends 2b and 3b of the magnetic sensor chips 2 and 3 at both ends of the magnetic sensor 1 in its length direction W. The leads 6 are brought into contact with the outer ends 2b and 3b of the magnetic sensor chips 2 and 3; thus, they are electrically connected to the magnetic sensor chips 2 and 3. In addition, a plurality of connection leads 7 are formed at prescribed positions lying in directions perpendicular to the length direction W. The connection leads 7 are electrically connected to bonding pads 5 of the magnetic sensor chips 2 and 3 via wires 4. In the present embodiment, not all the connection leads 7 are integrally formed together with the stages 10 and 11. That is, some connection leads 7 are arranged in proximity to corners relative to the length direction W and are not connected to the bonding pads 5 of the magnetic sensor chips 2 and 3. They are brought into contact with the outer ends 2b and 3b of the magnetic sensor chips 2 and 3.

All the leads 6 and the connection leads 7 are each composed of a metal material such as copper, wherein they are formed in a strip-like shape (or a comb-like shape). Back sides 6b of bases 6a of the leads 6 are exposed to the bottom 13a of the exterior mold package 13. Back sides 7b of bases 7a of the connection leads 7 are also exposed to the bottom 13a of the exterior mold package 13.

Middle portions 20 of the leads 6 in length directions are subjected to bending so that tip ends 6c are directed towards the top 13b of the exterior mold package 13, whereby it is possible to actualize inclination portions 15, which range from the middle portions 20 to the tip ends 6c of the leads 6 and which are inclined with respect to the bottom 13a of the exterior mold package 13. Surfaces 15a of the inclination portions 15 are arranged in the same planes as the surfaces 10a and 11a of the stages 10 and 11. The magnetic sensor chips 2 and 3 are respectively mounted on the surfaces 10a and 11a of the stages 10 and 11 supported by the surfaces 15a of the inclination portions 15. That is, the magnetic sensor chips 2 and 3 and the leads 6 partially overlap each other in a thickness direction H of the magnetic sensor 1.

Side surfaces 13c, which are formed at both side ends of the exterior mold package 13 in the length direction W, are each inclined by an angle $\theta_2$ that is an inwardly inclined angle and is set to 5° relative to the thickness direction H. In the condition where the magnetic sensor chips 2 and 3 are incorporated inside of the exterior mold package 13, the side surfaces 13c are formed in proximity to outer ends 19 of the magnetic sensor chips 2 and 3 respectively; that is, distances between the side surfaces 13c and the outer ends of the magnetic sensor chips 2 and 3 are shortened. Herein, the side surfaces 13c are broadened outwardly as the angle $\theta_2$ is reduced. In order to reduce the spaces between the side surfaces 13c and the outer ends 19 of the magnetic sensor chips 2 and 3, the side surfaces 13c are broadened in proximity to both ends of the exterior mold package 13.

Figure 3:
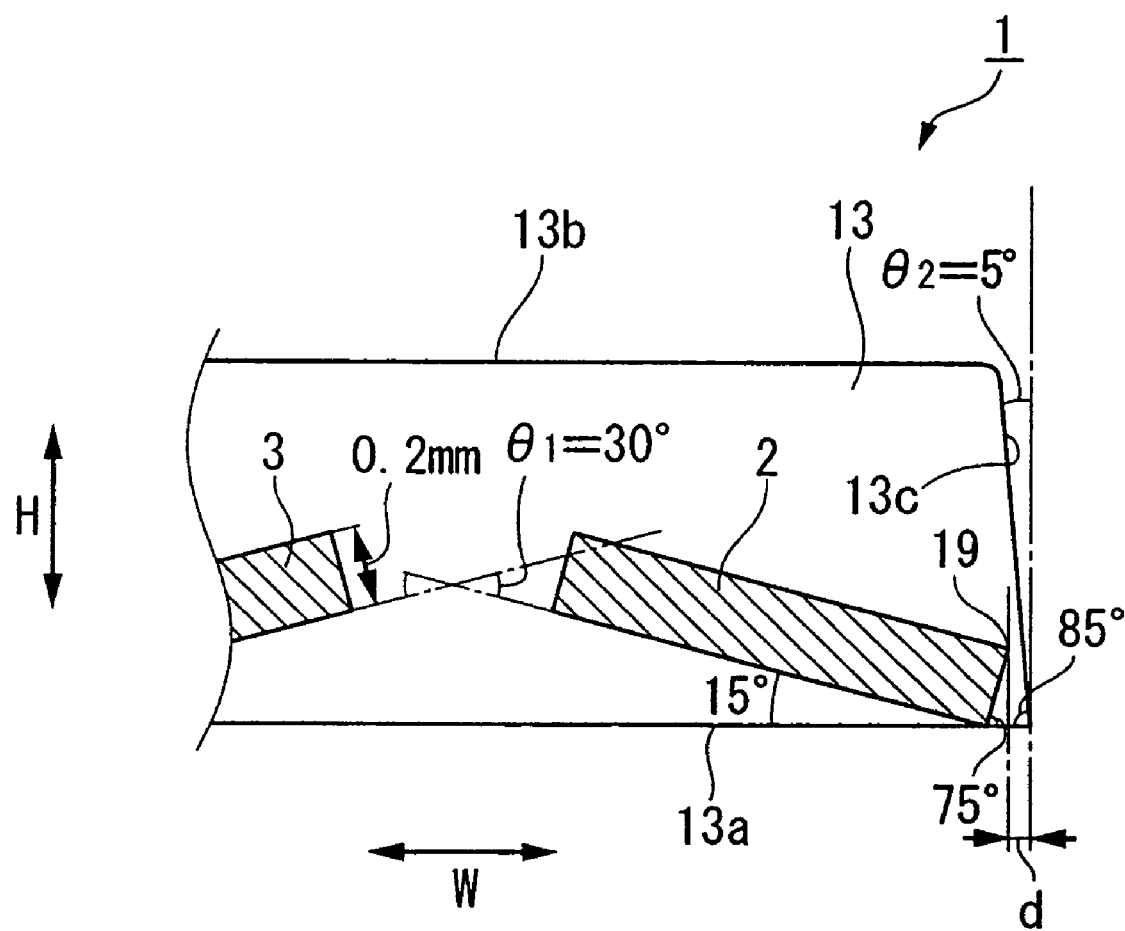
FIG. 3 is an enlarged cross-sectional view showing an inclination of a magnetic sensor chip encapsulated in an exterior mold package.

Specifically, as shown in FIG. 3, the present embodiment is designed such that each of the magnetic sensor chips 2 and 3 has a thickness of 0.2 mm; an inclination angle between the lower surfaces of the magnetic sensor chips 2 and 3 and the bottom 13a of the exterior mold package 13 is set to 15°. In addition, the angle $\theta_1$ between the A-B plane and the C-D plane is set to 30°.

Next, a manufacturing method of the magnetic sensor 1 will be described.

Figure 4:
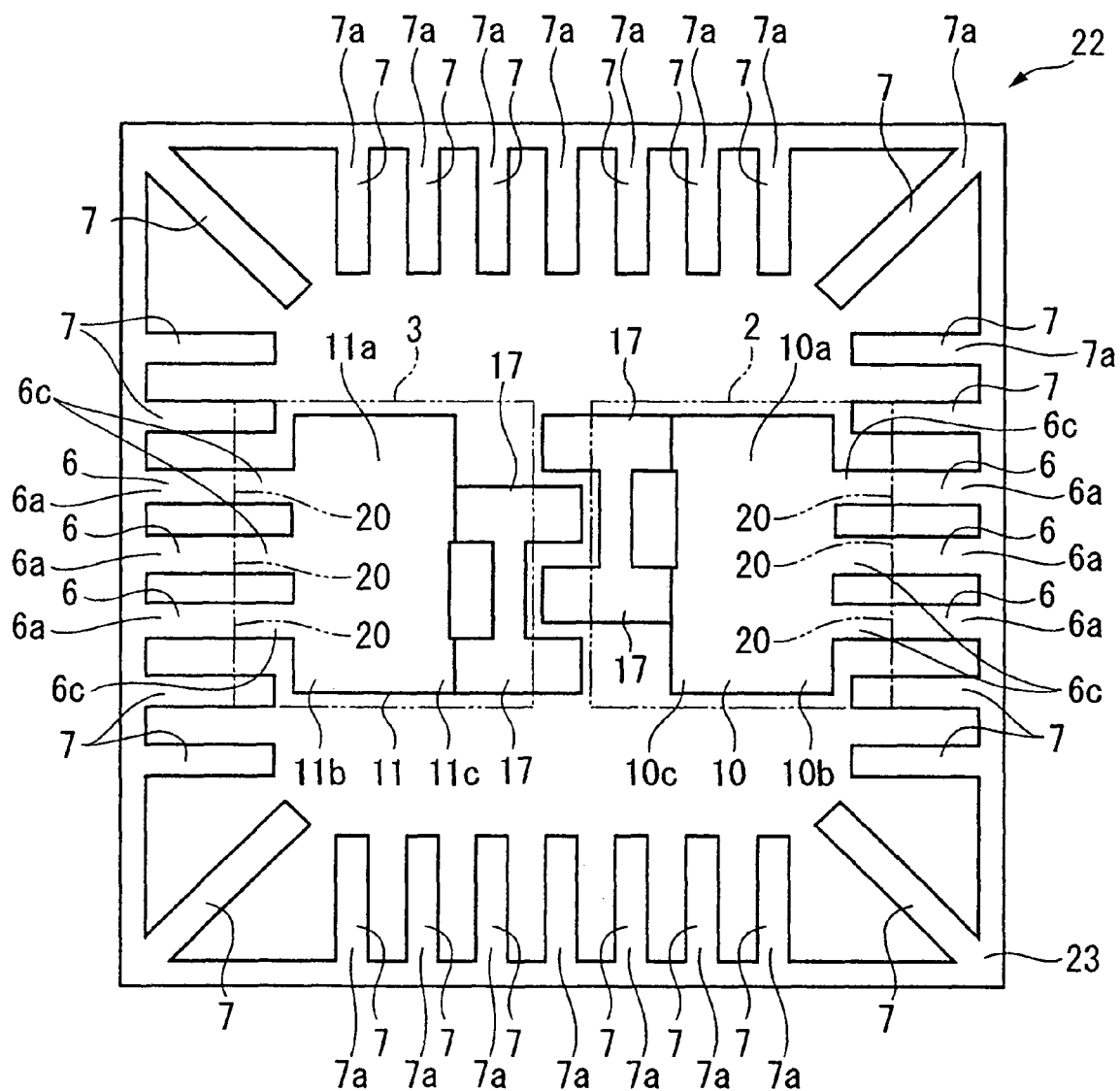
FIG. 4 is a plan view showing a lead frame for use in the magnetic sensor shown in FIG. 1.
Figure 5:
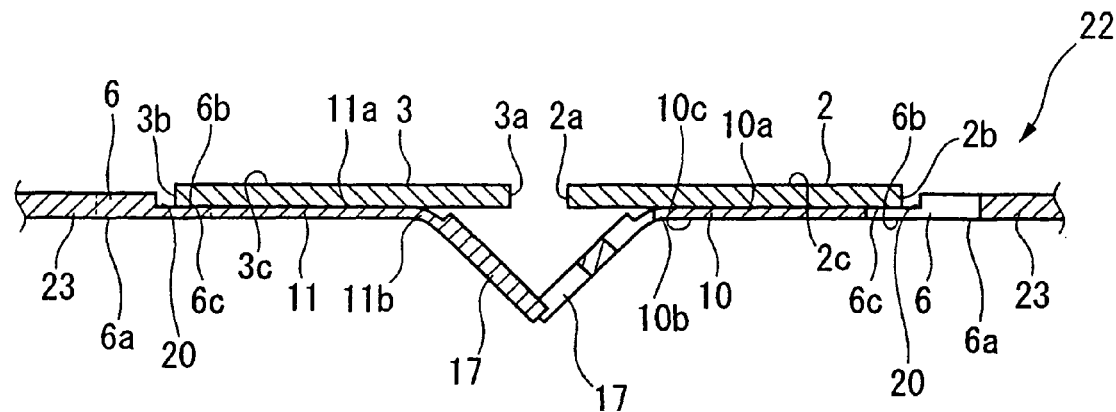
FIG. 5 is a side view showing essential parts of the lead frame.

First, a thin metal plate is subjected to press working and/or etching so as to form a lead frame 22 having a rectangular frame 23 that encompasses stages 10 and 11 as shown in FIGS. 4 and 5. A plurality of leads 6 and connection leads 7 are formed to inwardly project from all sides and corners of the rectangular frame 23.

Tip ends 6c of the leads 6 are interconnected to the stages 10 and 11 respectively. Prescribed regions of the leads that range from middle portions 20 to the tip ends 6c and that partially overlap opposite ends 10b and 11b of the stages 10 and 11 are formed in the same plane. In addition, selected regions of the leads 6 that are extended from the middle portions 20 to reach the opposite ends 10b and 11b of the stages 10 and 11 are subjected to photo-etching and are reduced in thickness compared with other regions. For example, the thickness of the selected regions of the leads 6 is reduced to a half of the thickness of bases 6a of the leads 6. The photo-etching is performed prior to press working, which is performed on the thin metal plate, in order to prevent the leads 6 and the connection leads 7 as well as back sides 10c and 11c of the stages 10 and 11 from being exposed in the lower surface of the exterior mold package 13.

Projections 17 are projected downwardly from the back sides 10c and 11c of the opposite ends 10b and 11b of the stages 10 and 11 in a slanted manner. The projections 17 are each formed in a thin rod shape, wherein the projection 17 attached to the first stage 10 is formed oppositely to the projection 17 attached to the second stage 11.

The projections 17 are used to avoid the occurrence of a supply failure of a resin material that is used to form the exterior mold package 13. It is preferable that the distance between the projections 17 is increased in order to precisely incline the stages 10 and 11 in a stable manner.

After the preparation of the lead frame 22 having the aforementioned structure, magnetic sensor chips 2 and 3 are respectively bonded onto the stages 10 and 11 in a bonding step. The magnetic sensor chips 2 and 3 are arranged in prescribed regions that range from the middle portions 20 to the tip ends 6c of the leads 6 to reach the opposite ends 10b and 11b of the stages 10 and 11, wherein the tip ends 6c of the leads 6 partially overlap the magnetic sensor chips 2 and 3 in the thickness direction.

The leads 6 are electrically connected to the bonding pads 5 that are formed on surfaces 2c and 3c of the magnetic sensor chips 2 and 3 via the wires 4 in a connection step.

It is preferable that the wires 4 be composed of a material having a bending ability and flexibility because after wiring, when the stages 10 and 11 are respectively inclined, mutual variations may occur with respect to bonding areas between the magnetic sensor chips 2 and 3 and the wires 4 and with respect to bonding areas between the leads 6 and the wires 4.

Figure 6:
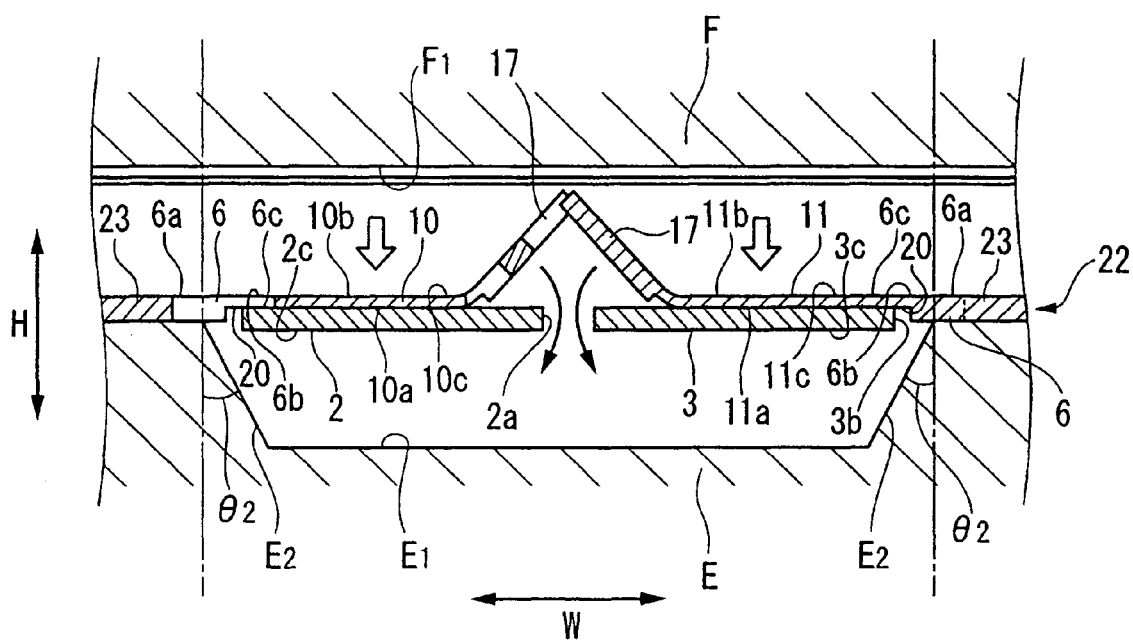
FIG. 6 is a cross-sectional view showing the lead frame held between metal molds.
Figure 7:
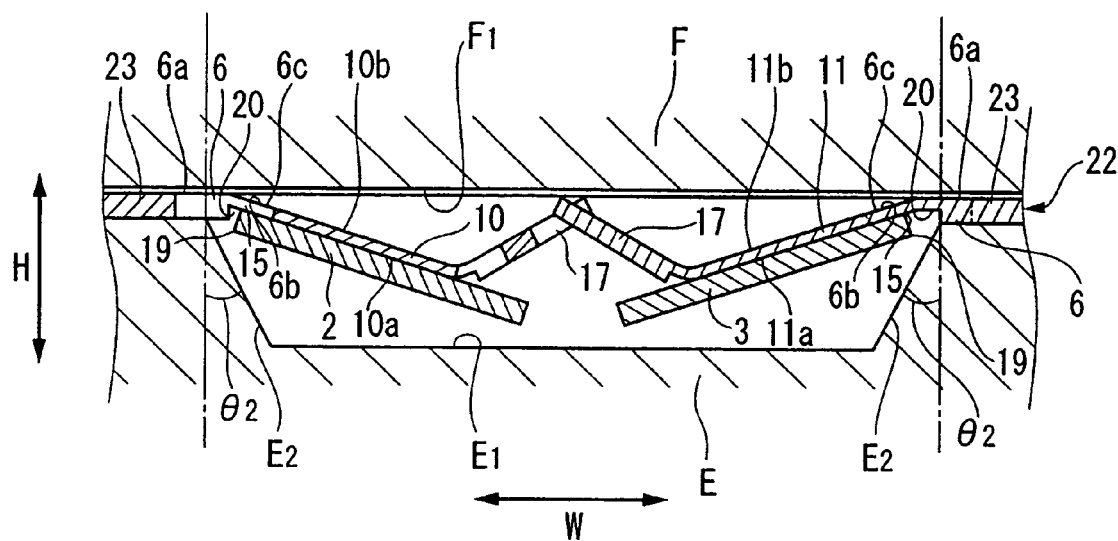
FIG. 7 is a cross-sectional view showing the lead frame that is subjected to pressing in a cavity between the metal molds.

Next, as shown in FIGS. 6 and 7, the lead frame 22 is sandwiched and fixed between metal molds E and F in a fixing step. The metal molds E and F are used to form the exterior mold package 13 for encapsulating the magnetic sensor chips 2 and 3. Side walls $E_2$ of the lower metal mold E are each inclined by the angle $\theta_2$, which is an inwardly inclined angle and is set to 5° relative to the thickness direction H.

When the metal molds E and F holding the lead frame 22 therebetween are subjected to pressing, the projections 17 are depressed by an interior wall $F_1$ of the upper metal mold F so that the middle portions 20 of the leads 6 are bent towards an interior wall $E_1$ of the lower metal mold E. That is, the tip ends 6c of the leads 6 are correspondingly bent about the middle portions 20 together with the stages 10 and 11 in connection with the upper mold F. This forms inclination portions 15 with respect to the leads 6. Thus, the magnetic sensor chips 2 and 3 are respectively inclined with respect to the interior wall $F_1$ of the upper mold F.

In the above, the outer ends 19 of the magnetic sensor chips 2 and 3 are arranged in proximity to the side walls $E_2$ of the lower mold E.

In the aforementioned state, a melted resin is injected into a cavity formed between the metal molds E and F so as to form the exterior mold package 13 encapsulating the magnetic sensor chips 2 and 3 in a molding step. That is, the magnetic sensor chips 2 and 3 are fixed inside of the exterior mold package 13 while they are inclined with respect to the bottom 13a of the exterior mold package 13.

Lastly, the lead frame 22 is extracted from the molds E and F; then, prescribed portions of the leads 6 and the connection leads 7, which are projected outside of the exterior mold package 13, are cut out together with the rectangular frame 23. Thus, it is possible to completely produce the magnetic sensor 1 shown in FIG. 1.

Incidentally, the present embodiment does not perform a dicing step because the side surfaces 13c of the exterior mold package 13 are each inclined by a small angle of 5°, which is further reduced to zero.

Next, a description will be given with respect to the operation of a physical quantity sensor (i.e., the magnetic sensor 1) having the aforementioned structure.

The magnetic sensor 1 is installed in a portable terminal device and is mounted on a substrate (not shown), for example. Due to the collaboration of the magnetic sensor chips 2 and 3, geomagnetic factors lying in directions A, B, C, and D are detected so as to produce detection signals, which are supplied to a calculation unit (not shown) attached onto the substrate via the leads 6 and the connection leads 7. The calculation unit performs calculations based on detection signals, so that the portable terminal device displays a geomagnetic bearing on a display panel (not shown).

As portable terminal devices have been reduced in dimensions, it is strongly demanded that physical quantity sensors be reduced in size. The present embodiment can easily reduce the overall size of the magnetic sensor 1 compared with conventional ones.

That is, the magnetic sensor 1 of the present embodiment is characterized in that, as shown in FIG. 3, the side surfaces 13c of the exterior mold package 13 are each inclined by the angle $\theta_2$ that is set to 5° and are formed in proximity to the outer ends 19 of the magnetic sensor chips 2 and 3. Herein, the lower ends of the bottom 13a project outwardly from the outer ends 19 of the magnetic sensor chips 2 and 3 in the length direction W by the following dimension d, which may be approximately 0.0166 mm.

$$d = 0.2 \times \frac{\sin 75°}{\tan 85°}$$

As described above, it is possible to minimize the dimension d by which the lower ends of the bottom 13a project outwardly. As a result, it is possible to reduce the overall area of the bottom 13a of the exterior mold package 13.

In short, the magnetic sensor 1 of the present embodiment is designed such that the side surfaces 13c of the exterior mold package 13 are each inclined by the angle $\theta_2$ which is set to 5° and are formed in proximity to the outer ends 19 of the magnetic sensor chips 2 and 3; hence, it is possible to reduce the overall area of the bottom 13a; thus, it is possible to easily downsize the magnetic sensor 1 with a simple structure.

In addition, the leads 6 are arranged to partially overlap with the magnetic sensor chips 2 and 3 in the thickness direction H; hence, it is possible to further reduce the dimension d by which the lower ends of the bottom 13a project outwardly; thus, it is possible to further reduce the size of the magnetic sensor 1.

Furthermore, due to the provision of the inclination portions 15 of the leads 6 by which the magnetic sensor chips 2 and 3 are arranged on the surfaces 15a, it is possible to easily incline the magnetic sensor chips 2 and 3 with respect to the bottom 13a of the exterior mold package 13.

As the side surfaces 13c are broadened outwardly, it is possible to increase the inclination angles of the magnetic sensor chips 2 and 3 while a reduction is secured with respect to the overall area of the bottom 13a; hence, it is possible to increase the angle $\theta_1$ between the A-B plane and the C-D plane; thus, it is possible to improve the sensitivity of the magnetic sensor 1 for detecting geomagnetism.

In the present embodiment, the angle $\theta_2$ for inclining the side surfaces 13c is set to 5°, which is not a restriction. That is, it is required that the angle $\theta_2$ ranges from 0° to 5°. In addition, dimensions of the magnetic sensor 1 can be appropriately changed.

The present embodiment can be modified in various ways, which will be described below.

(1) First Modification

Figure 8:
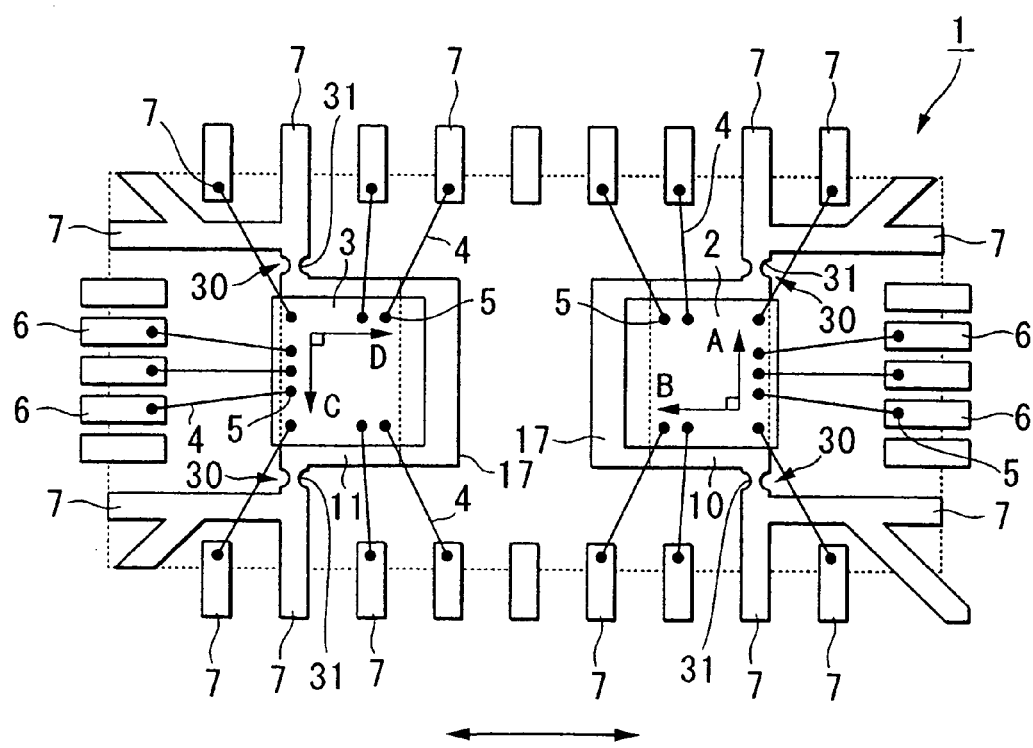
FIG. 8 is a plan view showing the structure of a physical quantity sensor in accordance with a first modification of the first embodiment.
Figure 9:
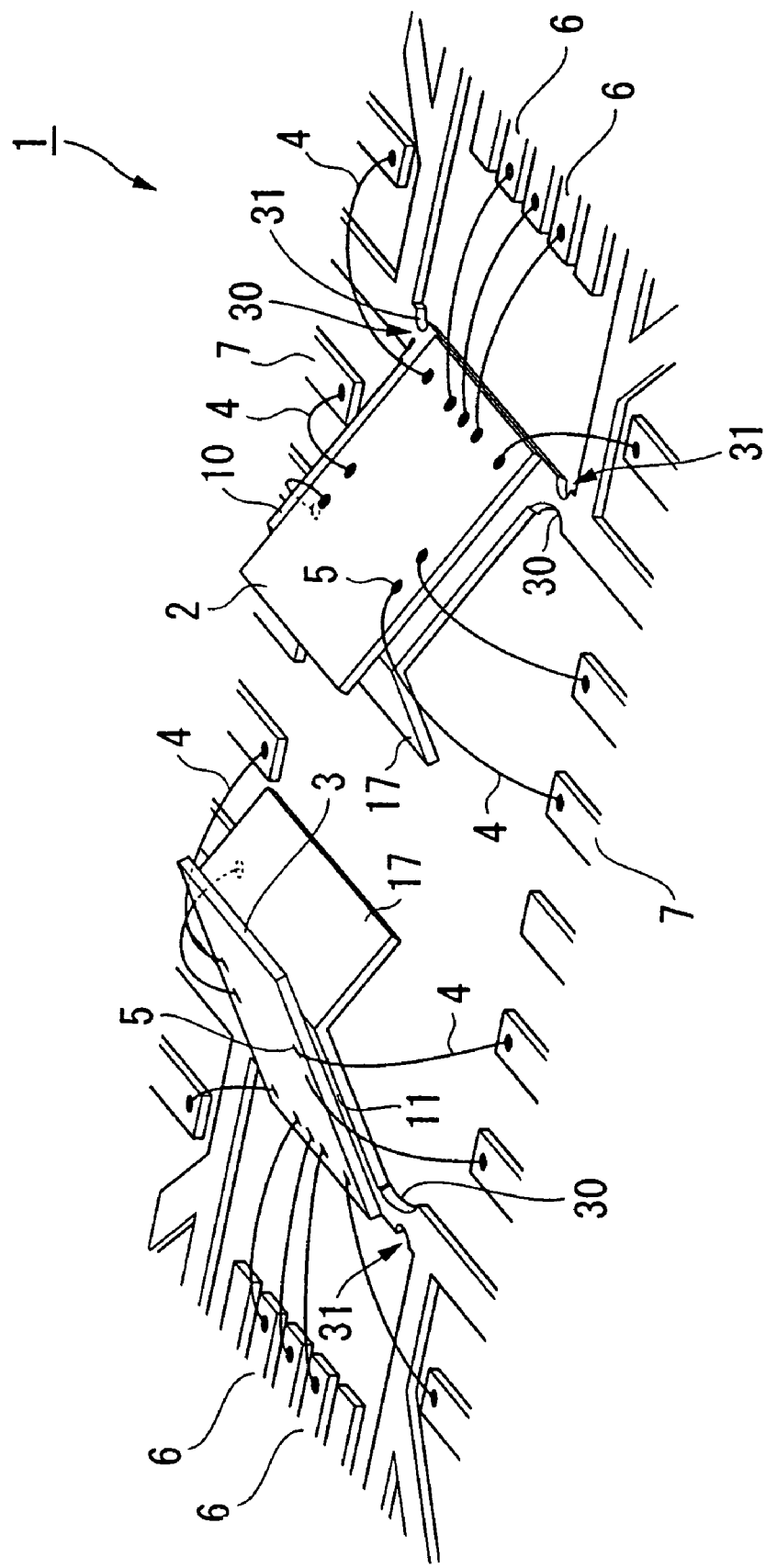
FIG. 9 is a perspective view showing stages and associated parts that are inclined in the physical quantity sensor according to the first modification.

FIGS. 8 and 9 show a first modification of the present embodiment, wherein parts identical to those shown in FIGS. 1 to 7 are designated by the same reference numerals; hence, the detailed description thereof will be omitted.

The first modification is basically similar to the present embodiment, so that the following description will be given with respect to differences therebetween.

In the first modification, as shown in FIG. 8, the projections 17 that project from the lower surfaces of the stages 10 and 11 are each elongated in a direction perpendicular to the length direction W, so that they are formed like plates whose widths substantially match the widths of the stages 10 and 11.

In addition, a plurality of interconnection portions 30 are additionally formed to establish interconnection between the connection leads 7 and the stages 10 and 11. The interconnection portions 30 are arranged opposite to each other at both ends of bases of the stages 10 and 11. Cutouts are formed on side areas of the interconnection portions 30 so as to form twisting portions 31 whose thickness is reduced compared with other portions of the connection leads 7. The twisting portions 31 can be easily deformed compared with the projections 17. Therefore, the projections 17 are subjected to pressing by metal molds so that the twisting portions 31 become deformed; hence, as shown in FIG. 9, it is possible to establish inclined states with respect to the stages 10 and 11.

As the projections 17 are formed like elongated plates, it is possible to secure satisfactory rigidity therefor; hence, it is possible to easily incline the stages 10 and 11. In addition, it is possible to reliably secure inclined states of the stages 10 and 11 in a stable manner.

Incidentally, the first modification is designed such that the leads 6 are not integrally formed together with the stages 10 and 11, wherein the leads 6 lying along both ends of the length direction W are electrically connected to the bonding pads 5 of the magnetic sensor chips 2 and 3, while other leads, i.e., the connection leads 7 are arranged to encompass the stages 10 and 11 irrespective of the leads 6.

(2) Second Modification

Figure 10:
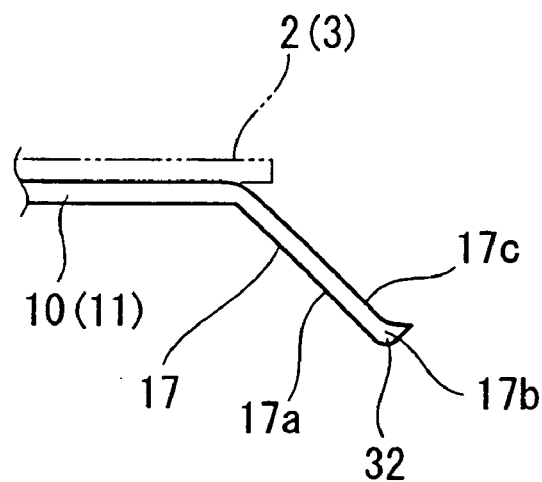
FIG. 10 is an enlarged side view showing a tip end of a projection that is modified in accordance with a second modification of the first embodiment.
Figure 11:
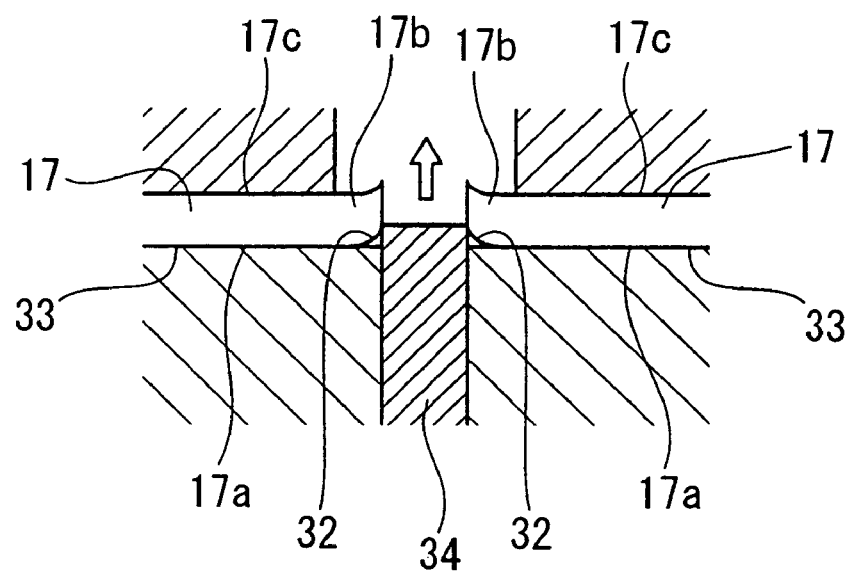
FIG. 11 is a cross-sectional view for explaining the formation of an R-shape portion at the tip end of the projection shown in FIG. 10.

FIGS. 10 and 11 show a second modification of the present embodiment, wherein the second modification is basically similar to the present embodiment; hence, the following description will be given with respect to differences therebetween.

In the second modification, as shown in FIG. 10, an R-shape portion 32 having a smooth round shape is formed at a tip end 17b of a backside 17a of the projection 17. The R-shape portion 32 is formed as follows:

When the aforementioned lead frame 22 is formed in a punching step in which the projection 17 is fixed in position by a die 33 (see FIG. 11), punching is performed using a punch 34 with respect to the projection 17 in a direction from the backside 17a to the surface 17c, wherein the tip end 17b of the projection 17 is deformed at edges thereof, thus forming the R-shape portion 32.

Of course, the tip end 17b is not necessarily formed by punching. That is, it is possible to introduce any measures that realize the formation of a round shape at the tip end 17b of the projection 17.

The second modification can demonstrate prescribed effects similar to those of the first modification. In addition, as the R-shape portion 32 is brought into contact with the interior wall of the metal mold that presses the projection 17, it is possible to prevent the metal mold from being damaged; hence, it is possible to improve the durability of the metal mold. Generally, a prescribed sheet is arranged on the interior wall of the metal mold in order to realize easy separation of a product from the metal mold. The second modification is advantageous in that as the R-shape portion 32 is brought into contact with the sheet, it is possible to reliably prevent the sheet from being damaged by the tip end 17b of the projection 17, which may be conventionally cut into the sheet.

(3) Third Modification

Figure 12:
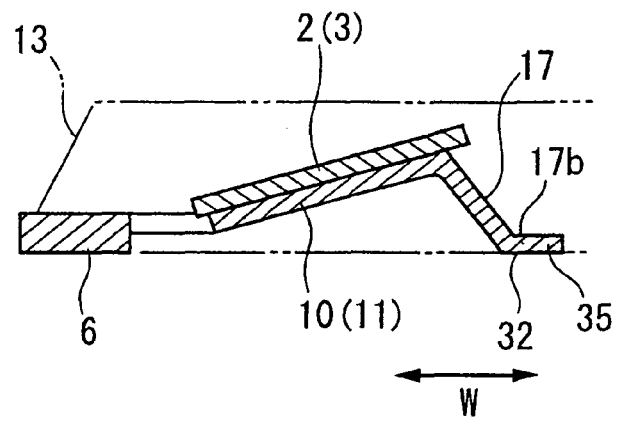
FIG. 12 is a side view showing that the tip end of a projection for inclining a stage is extended in accordance with a third modification of the first embodiment.
Figure 13:
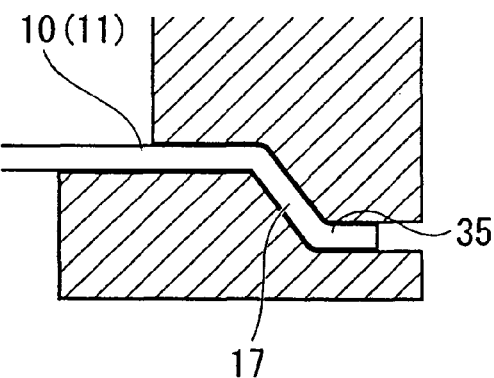
FIG. 13 is a cross-sectional view for explaining the formation of an extended portion that extends from the tip end of the projection shown in FIG. 12.

FIGS. 12 and 13 show a third modification of the present embodiment, wherein the third modification is basically similar to the present embodiment; hence, the following description will be given with respect to differences therebetween.

In the third modification, as shown in FIG. 12, the tip end 17b of the projection 17 is extended across the overall length thereof in the length direction W so as to form an extended portion 35, which is integrally formed together with the tip end 17b of the projection 17.

The extended portion 35 is formed by bending the tip end 17b of the projection 17. It is preferable that, as shown in FIG. 13, bending be performed using metal molds simultaneously with the inclination of the stages 10 and 11.

The third modification can demonstrate prescribed effects similar to those of the second modification. In addition, as a depression applied to the projection 17 in metal molds is received by the extended portion 35, it is possible to easily incline the stages 10 and 11; hence, it is possible to reliably secure inclined states of the stages 10 and 11 in a stable manner.

Figure 14:
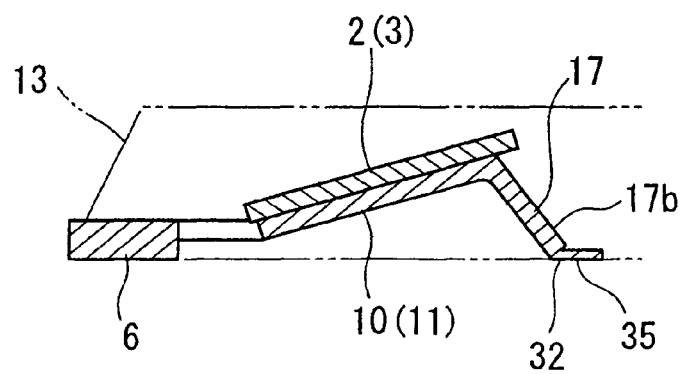
FIG. 14 is a side view showing that the extended portion is reduced in thickness compared with other portions of the projection shown in FIG. 12.

In the bending of the projection 17, it is possible to additionally perform press working or photo-etching on the surface and backside of the extended portion 35, which is thus reduced in thickness compared with other portions as shown in FIG. 14. This realizes easy bending of the extended portion 35.

(4) Fourth Modification

Figure 15:
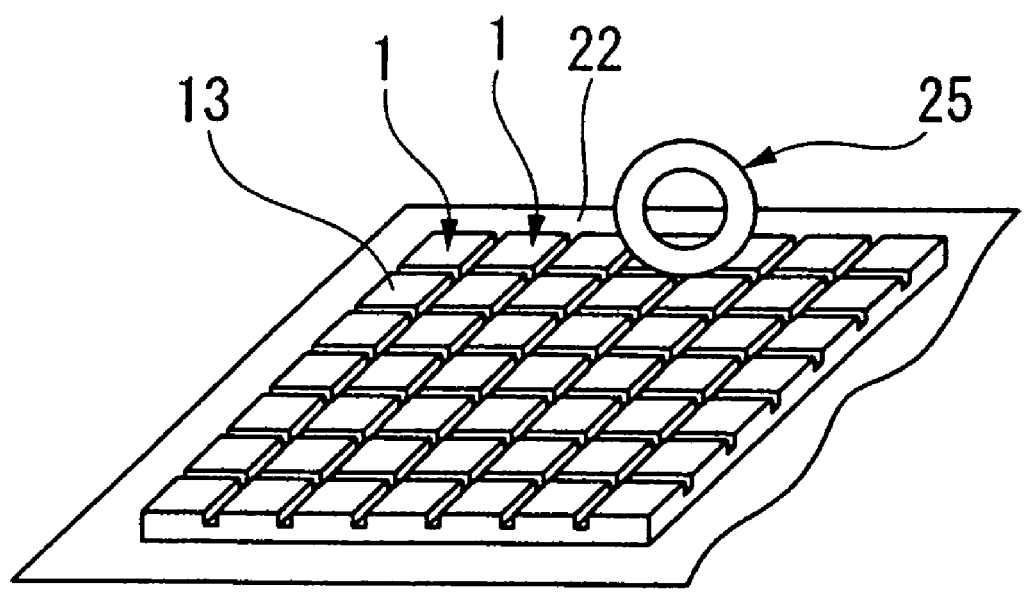
FIG. 15 is a perspective view showing a lead frame realizing a plurality of magnetic sensors in accordance with a fourth modification of the first embodiment.
Figure 17:
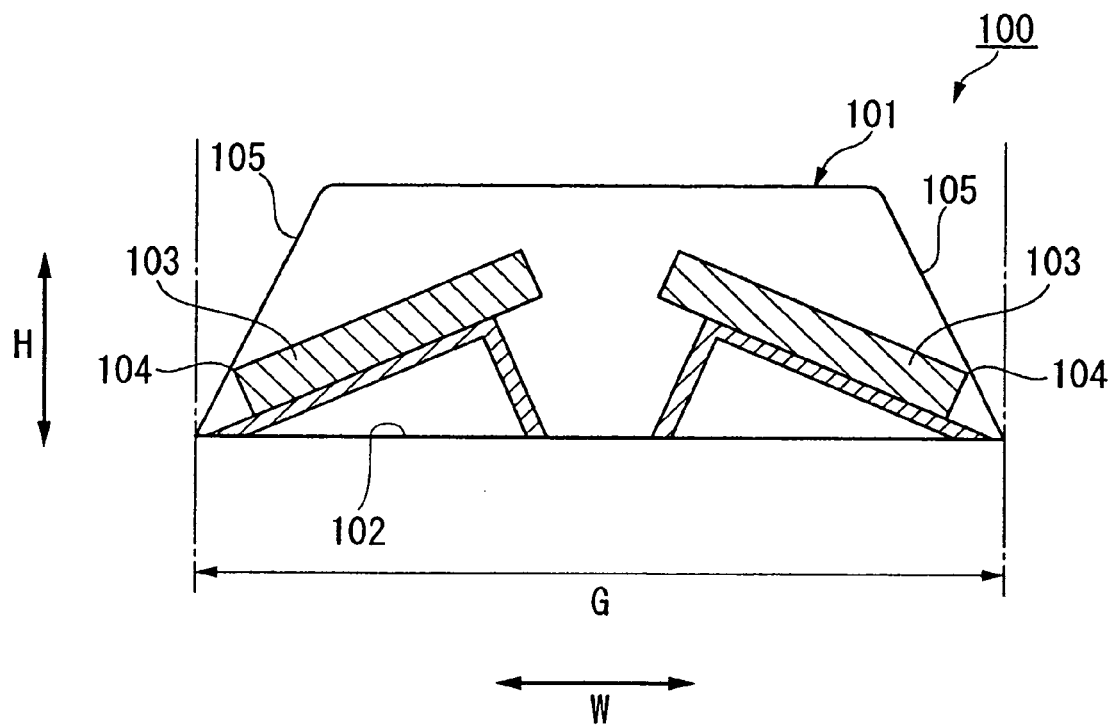
FIG. 17 is a cross-sectional view showing a typical structure of a conventionally-known magnetic sensor having two chips inclined with respect to each other.
Figure 18:
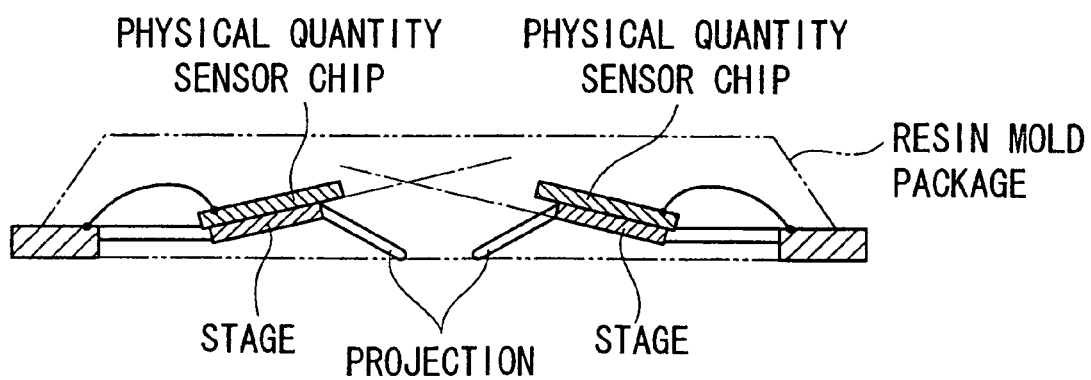
FIG. 18 is a traverse cross-sectional view showing the structure of a conventionally-known physical quantity sensor.

FIG. 15 shows a fourth modification of the present embodiment, wherein parts identical to those shown in FIGS. 1 to 7 are designated by the same reference numerals; hence, the detailed description thereof will be omitted.

The fourth modification is basically similar to the present embodiment, wherein the following description will be given with respect to differences therebetween.

In short, a magnetic sensor 1 according to the fourth modification is characterized in that the side surfaces 13c of the exterior mold package 13 are not inclined; that is, the angle $\theta_2$ is set to zero.

Similar to the present embodiment, a manufacturing method of the fourth modification includes a bonding step, a connection step, a fixing step, and a molding step. In addition, the fourth modification additionally introduces a dicing step in which the lead frame 22 and the exterior mold package 13 are subjected to dicing such that the inclination angle of the side surfaces 13c of the exterior mold package 13 is forced to be zero in the thickness direction H, hence, the side surfaces 13c are formed close to the outer ends 19 of the magnetic sensor chips 2 and 3.

This manufacturing method is a so-called MAP method, in which similar to the present embodiment, a series of steps (including the bonding step and molding step described above) are performed; then, the lead frame 22 substantially encapsulated in the exterior mold package 13 is subjected to cutting using a blade 25, so that the side surfaces 13c are formed to be perpendicular to the bottom 13a.

A single pair of the magnetic sensor chips 2 and 3 can be necessarily subjected to a molding step at once. In the fourth modification, there is provided one sheet of a large lead frame including plural pairs of magnetic sensor chips, all of which are simultaneously subjected to molding, so that the blade 25 is used to isolate individual units of magnetic sensors.

As the side surfaces 13c of the exterior mold package 13 are not inclined so that the inclination angle thereof is set to zero, it is possible to further reduce the overall area of the bottom 13a of the exterior mold package 13; hence, it is possible to further reduce the size of the magnetic sensor 1.

(5) Fifth Modification

FIG. 16 shows a fifth modification of the present embodiment, wherein parts identical to those shown in FIG. 15 are designated by the same reference numerals; hence, the detailed description thereof will be omitted.

The fifth modification is basically similar to the fourth modification, wherein the following description will be given with respect to difference therebetween.

The fifth modification does not use the foregoing dicing step but performs cutting on a lead frame 22, which is fixed in metal molds, in accordance with a through-gate method.

In the through-gate method, metal molds provide cavities that are used to form a plurality of chips and that are connected via runner gates 27. Cavities close to pods are sequentially filled with a resin, so that a resin introduced into one cavity is supplied to a next cavity via the runner gate 27. After completion of the molding step, a cutting metal mold is used to cut the lead frame 22 into individual units of magnetic sensors 1, which are then extracted. Thus, it is possible to simultaneously produce a plurality of magnetic sensors 1.

The fifth modification can demonstrate prescribed effects similar to those of the fourth modification.

The present embodiment and its modifications are all related to magnetic sensors, which is not a restriction. Hence, they can be applied to various types of physical quantity sensors such as acceleration sensors.

In addition, it is possible to create further modifications within the scope of the present invention with regard to the first embodiment. For example, when chips are further reduced in size, it is possible to increase the aforementioned inclination angle, which originally ranges from 0° to 5° but which can range from 10° to 20°. Even when the inclination angle is increased by use of chips of smaller sizes, it is possible to demonstrate the same effects as described in conjunction with the first embodiment and its modifications.

2. Second Embodiment

The second embodiment of the present invention is related to a manufacturing method of a physical quantity sensor, namely, a three-dimensional magnetic sensor for measuring geomagnetism, which will be described below.

First, the overall structure of a magnetic sensor produced by the manufacturing method of the second embodiment will be described with reference to FIGS. 19 to 23.

Figure 19:
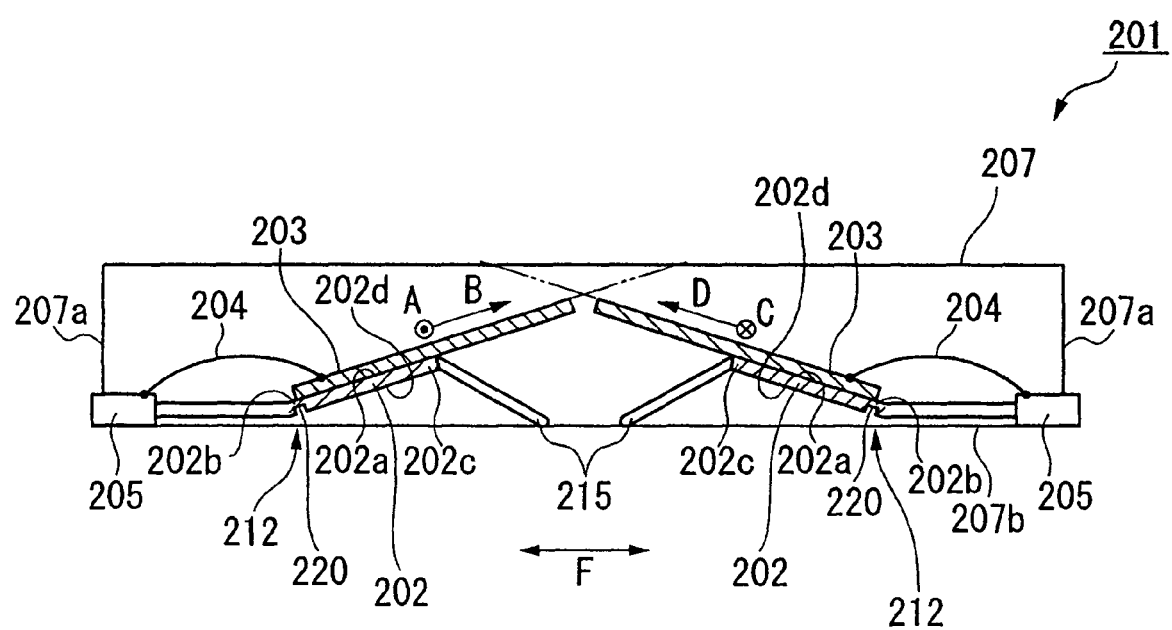
FIG. 19 is a cross-sectional view showing essential parts of a magnetic sensor that is produced in accordance with a second embodiment of the present invention.

That is, a magnetic sensor 201 shown in FIG. 19 includes two stages 202 that are mutually inclined, two magnetic sensor chips 203 that are mounted on surfaces 202a of the stages 202 so as to measure the magnitude and direction of an external magnetic field, a plurality of leads 205 that are electrically connected to the magnetic sensor chips 203 via wires 204, and an exterior mold package (or a resin mold package) 207. Side walls 207a of the exterior mold package 207 stand vertically on a bottom 207b.

Figure 20:
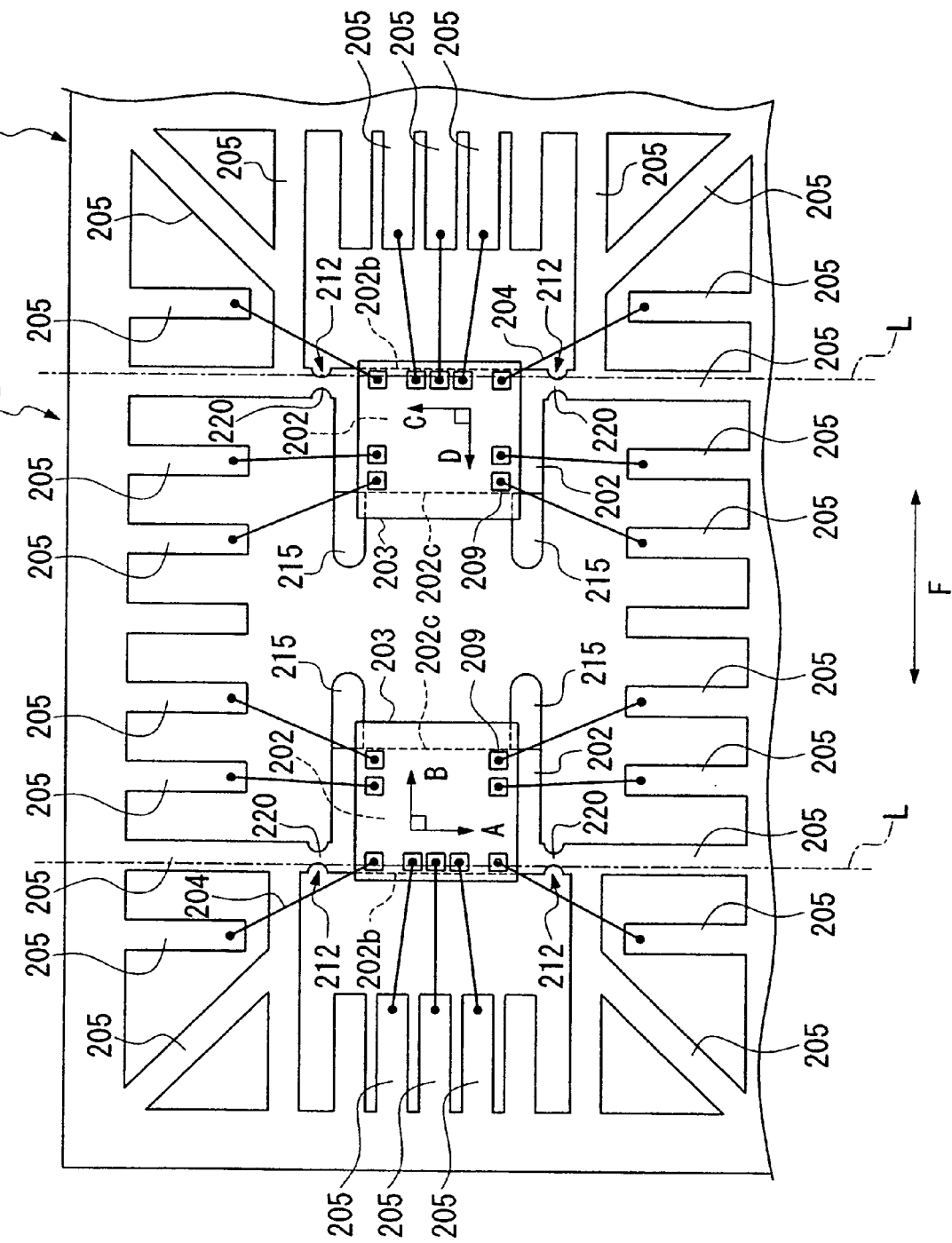
FIG. 20 is a plan view showing a lead frame having stages, on which magnetic sensor chips are mounted, for use in the magnetic sensor shown in FIG. 19.

The magnetic sensor 201 is produced using a lead frame 210 including the stages 202 and the leads 205 as shown in FIG. 20.

Next, the details of the lead frame 210 will be described. The lead frame 210 is formed through press working and/or etching performed on a thin metal plate 214 such as a copper plate shown in FIG. 21. In the present embodiment, a plurality of lead frames 210 are extracted from one sheet of the thin metal plate 214. Of course, it is possible to appropriately change the number of lead frames and forming positions of lead frames in the thin metal plate 214.

As shown in FIG. 20, the lead frame 210 includes two stages 202 each having a rectangular shape in plan view, a frame portion 211 having a plurality of leads 205 encompassing the stages 202, and a plurality of interconnection portions 212, which interconnect the prescribed leads 205 and the stages 202 and which are formed at both ends of bases 202b of the stages 202, which are arranged opposite to each other.

Figure 21:
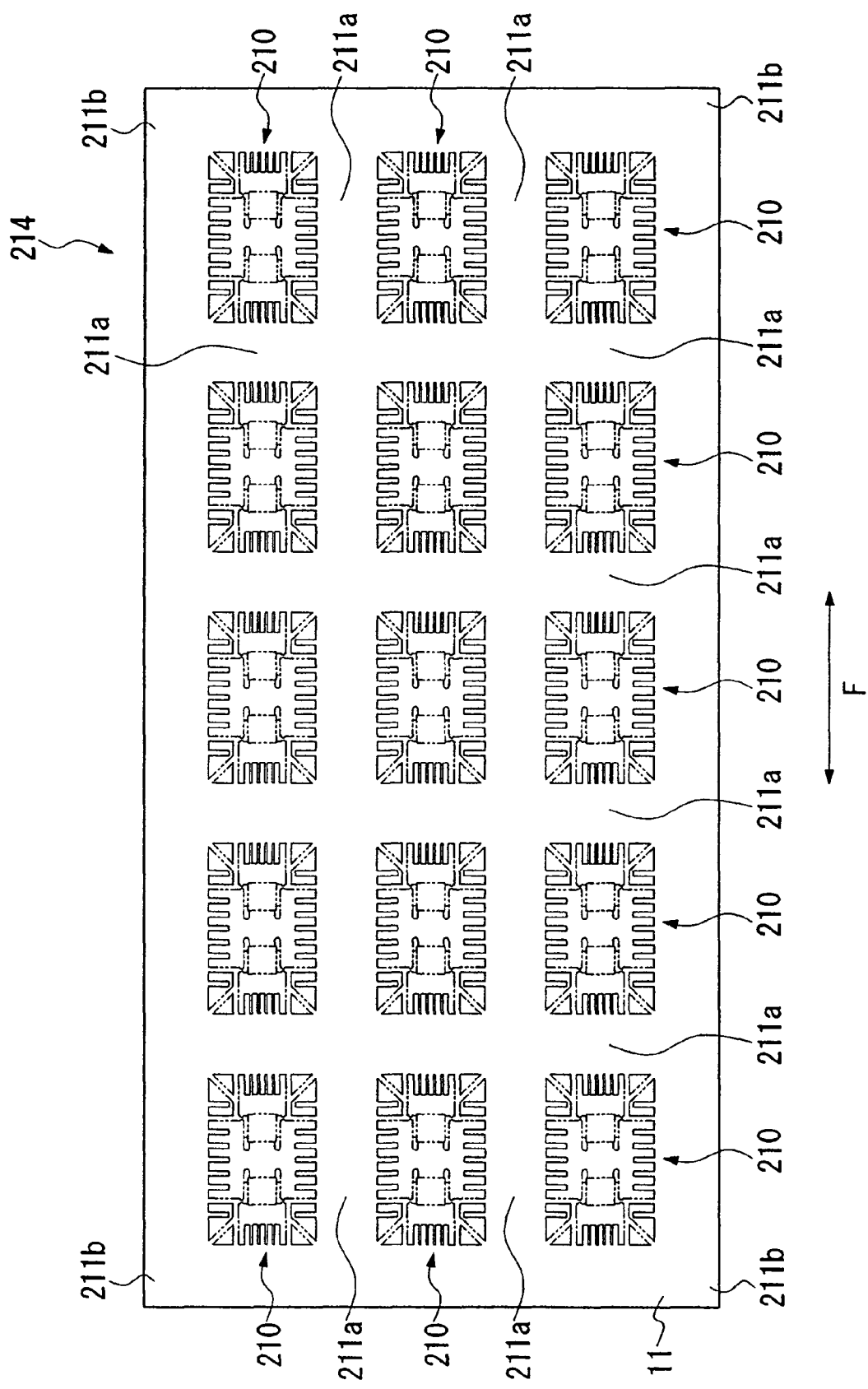
FIG. 21 is a plan view showing a thin metal plate on which a plurality of lead frames each shown in FIG. 20 are formed.
Figure 22:
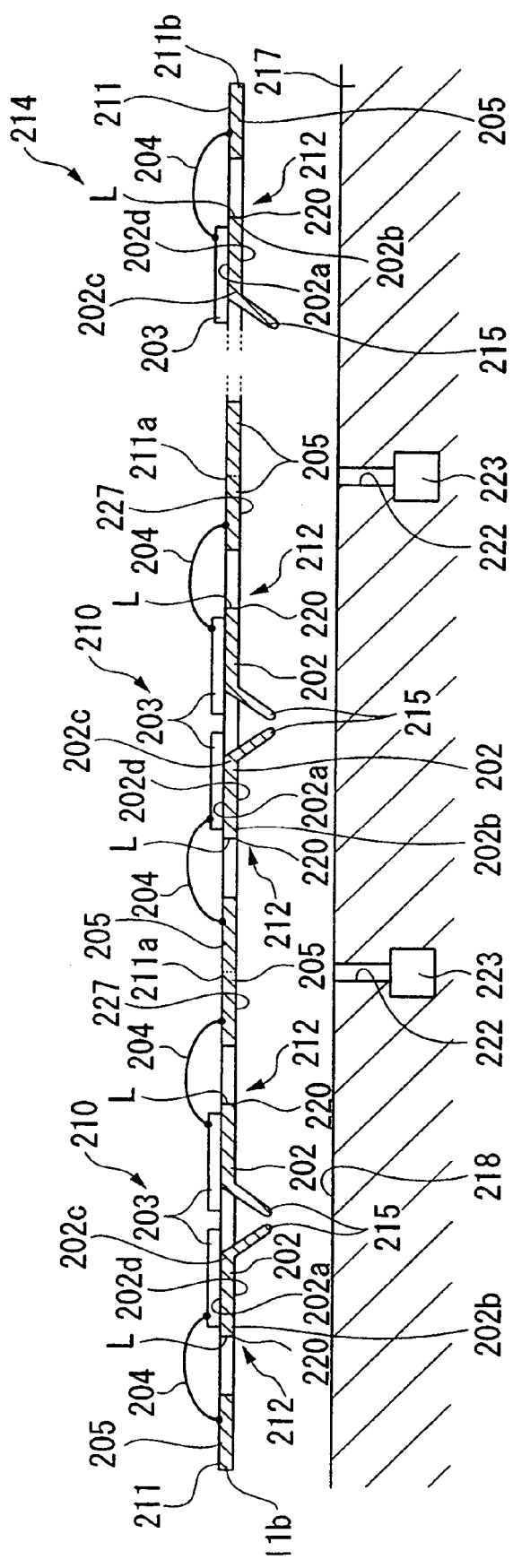
FIG. 22 is a cross-sectional view showing that the thin metal plate of FIG. 21 is placed on a base.

As shown in FIG. 21, the frame portion 211 as a whole corresponds to the thin metal plate 214 having a rectangular shape in plan view so as to encompass a plurality of lead frames 210 therein. Specifically, the frame portion 211 includes intermediate portions 211a, each of which is formed between the lead frames 210 in proximity to the stages 202, and outer peripheral portions 211b, which correspond to the outer periphery of the thin metal plate 214.

Some leads 205 within the leads 205 integrally formed with the frame portion 211 serve as hanging leads for fixing the stages 202 to the frame portion 211 as shown in FIG. 20 and are respectively connected to the stages 202 via the interconnection portions 212.

Within a single lead frame 210, two stages 202 are disposed in a longitudinal direction F of the frame portion 211 such that tip ends thereof (i.e., opposite ends 202c of the stages 202) are arranged opposite to each other. Each of the stages 202 has a pair of projections 215 that are elongated inwardly from both ends of the tip end 202c thereof towards the other stages 202 in the longitudinal direction F. The two projections 215 are formed integrally together with each of the stages 202. By bending bases of the projections 215, the projections 215 are respectively projected from lower surfaces (or back sides) 202d of the stages 202 and are thus inclined with respect to the stages 202.

Magnetic sensor chips 203 are respectively mounted on upper surfaces 202a of the stages 202 and are each sensitive to two magnetic factors lying in two directions of an external magnetic field. Within a single lead frame 210 shown in FIG. 20, one magnetic sensor chip 203 is sensitive to two directions (i.e., directions A and B) that cross at a right angle on the surface thereof; and the other magnetic sensor 203 is sensitive to the other two directions (i.e., directions C and D) that cross at a right angle on the surface thereof. Incidentally, the directions A and C are reverse to each other with respect to the perpendicular direction of the longitudinal direction F; and the directions B and D are reverse to each other in parallel with the longitudinal direction F.

Of course, it is possible to modify the present embodiment such that the other magnetic sensor chip 203 has a sensitivity in the direction D only. Alternatively, the other magnetic sensor chip 203 can be installed in a horizontal manner.

The interconnection portions 212 have twisting portions 220 that are reduced in thickness compared with other portions of the leads 205 due to the provision of cutouts formed in both sides thereof. The twisting portions 220 are easy to be deformed compared with the projections. Thus, when the projections 215 are pressed upwardly in a direction from the lower surface 202d to the upper surface 202a of the stage 202, the twisting portions 220 are twisted, so that the stage 202 rotates about an axial line L passing through the twisting portions 220.

Next, a manufacturing method of the magnetic sensor 201 using the aforementioned lead frame 210 will be described in detail.

As shown in FIG. 21, a single sheet of the thin metal plate 214 is subjected to press working and/or etching so as to form a plurality of lead frames 210 in a frame forming step.

In a bonding step, the magnetic sensor chips 203 are respectively bonded onto upper surfaces 202a of the stages 202. In this step, the magnetic sensor chips 203 are controlled in such a way that sensing directions thereof are aligned as shown in FIG. 20.

Next, the leads 205 are connected to bonding pads 209 of the magnetic sensor chips 203 via the wires 204 in a connection step. Thus, it is possible to electrically connect the magnetic sensor chips 203 and the leads 205 together. When the stages 202 are inclined, variations may occur with respect to bonding areas between the magnetic sensor chips 203 and the wires 204 and with respect to bonding areas between the leads 205 and the wires 204. Hence, it is preferable that the wires 204 be composed of materials having a bending ability and flexibility.

Figure 23:
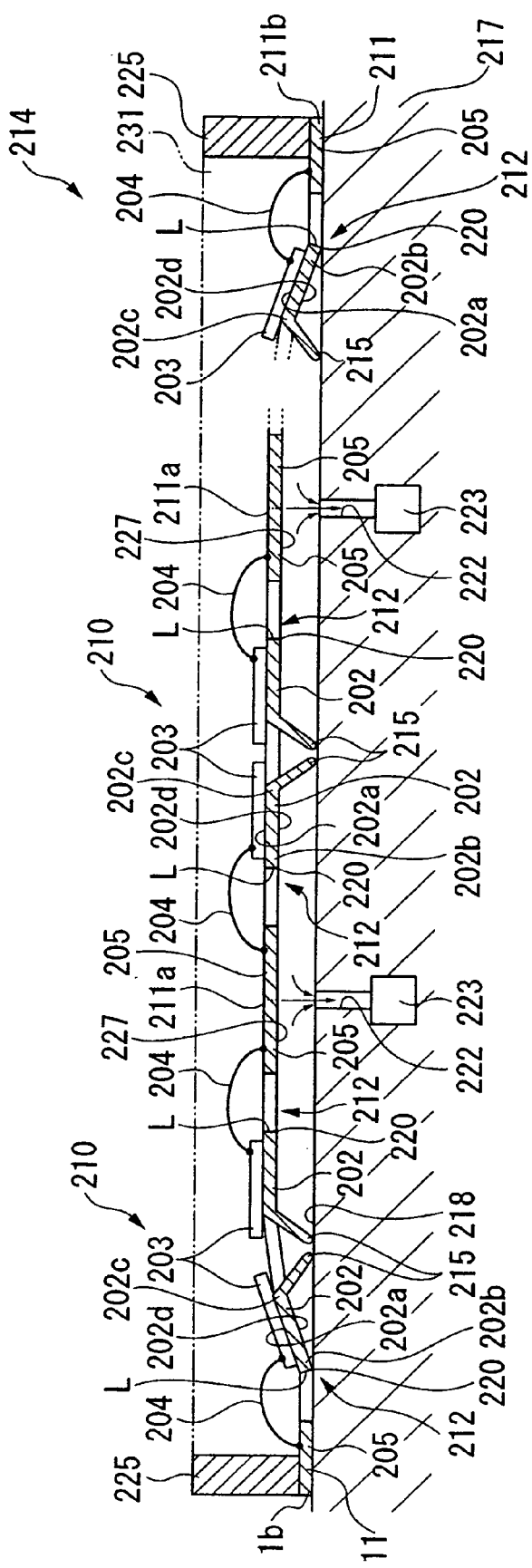
FIG. 23 is a cross-sectional view showing that the thin metal plate of FIG. 21 is subjected to clamping on the base.
Figure 24:
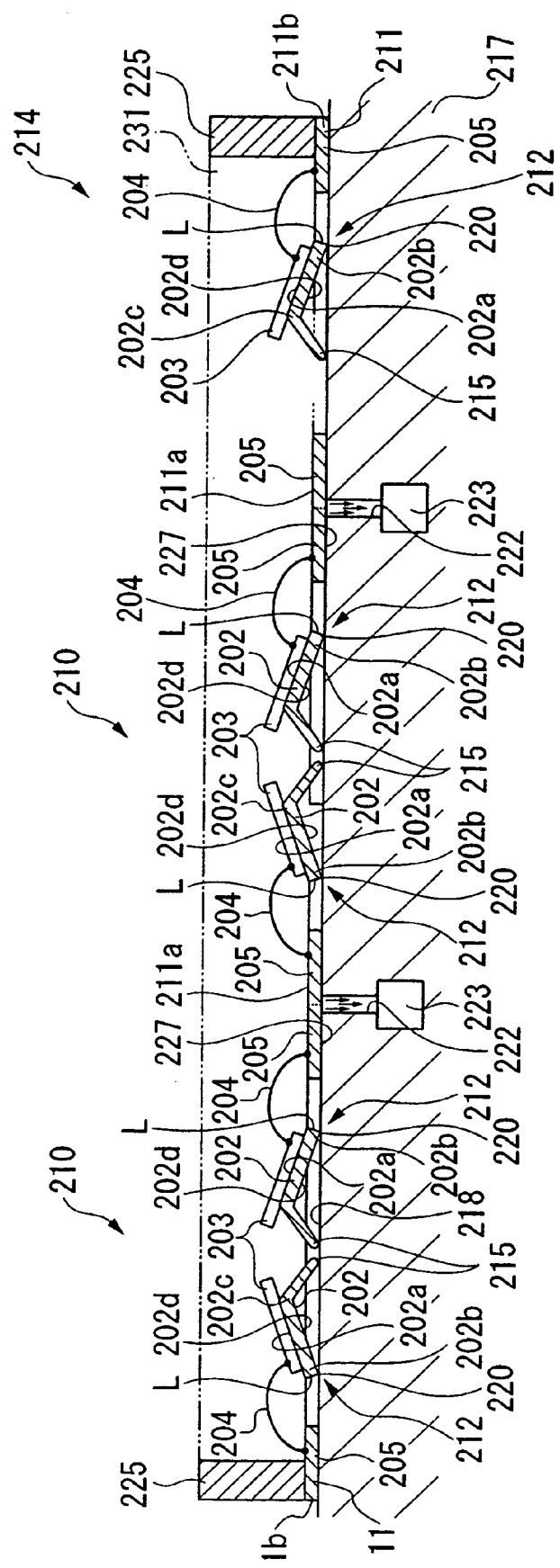
FIG. 24 is a cross-sectional view showing that selected portions of the thin metal plate shown in FIG. 23 are subjected to absorption so as to incline stages on the base.

Next, as shown in FIG. 23, the thin metal plate 214 that is completed in the connection step is installed in the equipment and is placed at a prescribed position on a base 217 in an installation step. The base 217 has a planar surface 218 on which the thin metal plate 214 is placed. In addition, the base 217 has a plurality of absorption holes 222 that are arranged in conformity with the intermediate portions 211a of the frame portion 211. One end of each of the absorption holes 222 is opened on the planar surface 218, and the other end is each connected with absorption devices 223.

As described above, the thin metal plate 214 is mounted at the prescribed position on the planar surface 218 of the base 217. Then, the outer peripheral portions 211b of the frame portion 211 are pressed and closely attached to the planar surface 218 of the base 217 using a clamp 225 having a frame-like shape whose size substantially matches the rectangular area defined by the outer peripheral portions 211b of the frame portion 211. As the outer peripheral portions 211b of the frame portion 211 are subjected to pressing using the clamp 225, the projections 215 of the stages 202, which are arranged close to the outer peripheral portions 211b, are pressed upwardly by the planar surface 218. Thus, the opposite ends 202c of the stages 202 are lifted up while the twisting portions 220 are being twisted, wherein the stages 202 mutually rotate about axial lines L. The stages 202 are inclined with respect to the frame portion 211. In contrast, the stages 202 that are arranged in the center area of the thin metal plate 214 are supported by the projections 215 in such a way that they are floating above the planar plane 218 because the intermediate portions 211a arranged thereby are not subjected to pressing and are thus free. This makes it possible for the thin metal plate 214 to be fixed in position such that the intermediate portions 211a are placed just above the absorption holes 222. Incidentally, internal walls of the clamp 225 are vertically extended with respect to the planar surface 218.

After completion of the installation step, the absorption devices 223 are driven so that lower surfaces 227 of the intermediate portions 211a (corresponding to the lower surface of the frame portion 211) are subjected to absorption by the absorption holes 222. This produces pressure differences in the absorption holes 222, so that the intermediate portions 211a positioned just above the absorption holes 222 are absorbed by the absorption devices 223. For this reason, the intermediate portions 211a are forced to move downward and are closely attached onto the planar plane 218. Thus, the entire area of the thin metal plate 214 is brought into contact with the planar surface 218. In this case, the projections 215 are pressed upwardly by the planar surface 218, so that the opposite ends 202c of the stages 202, which are originally floating above the planar surface 218, are lifted up while the twisting portions 220 are being twisted; hence, the stages 202 mutually rotate about the axial lines L. As a result, all the stages 202 are inclined with respect to the frame portion 211 in an inclination step.

Figure 25:
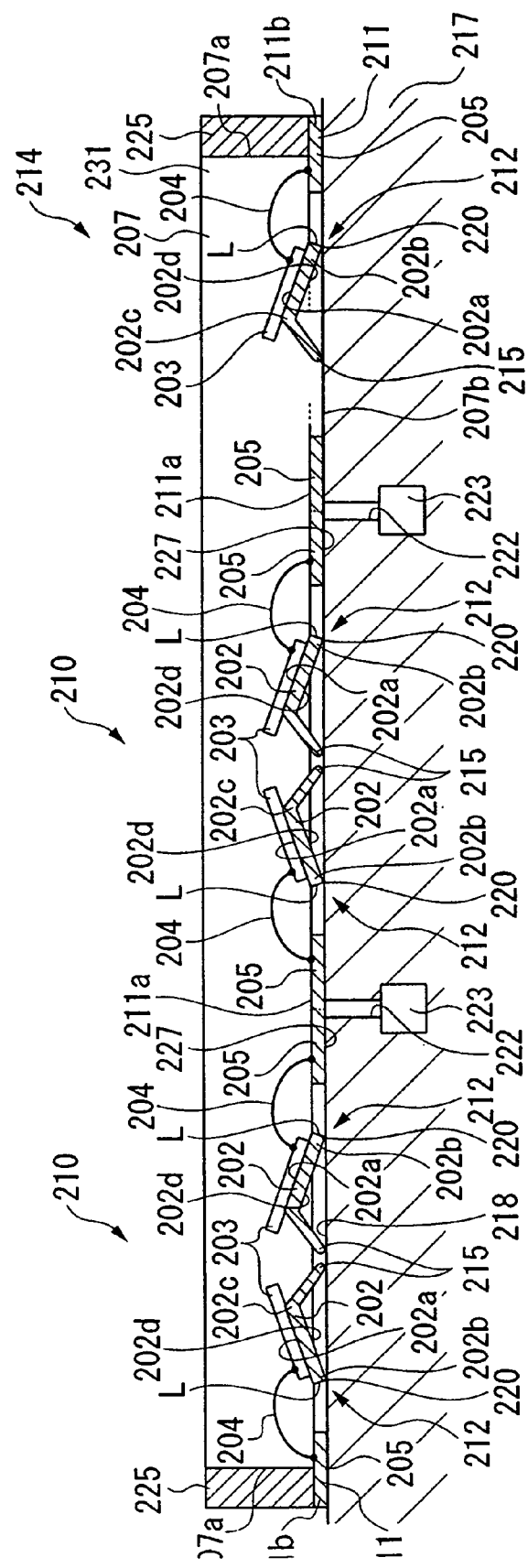
FIG. 25 is a cross-sectional view showing that a resin is introduced into a space holding the thin metal plate shown in FIG. 24.

Other steps subsequent to the inclination step are realized in a so-called MAP method. That is, a resin is introduced into a mold space 231 defined by the internal walls of the clamp 225 and the planar surface 218; then, it is maintained for a prescribed time period; thus, as shown in FIG. 25, it is possible to form an exterior mold package 207 sealing the stages 202, magnetic sensor chips 203, and leads 205 in a molding step, wherein the magnetic sensor chips 203 are mutually inclined and are fixed inside of the exterior mold package 207. It is preferable that the resin be composed of materials having a high flexibility in order to prevent inclination angles of the stages 202 and magnetic sensor chips 203 from being unexpectedly varied. After completion of the formation of the exterior mold package 207, the clamp 225 is removed; thus, as shown in FIG. 16, side walls 207a of the exterior mold package 207 are vertically extended from a bottom 207b.

After the removal of the clamp 225, the exterior mold package 207 and the frame portion 211 are subjected to cutting using a blade so as to isolate individual units of lead frames 210 in a dicing step. Thus, it is possible to produce the magnetic sensor 201 having the lead frame 210 in which the side walls 207a of the exterior mold package 207 are vertically extended from the bottom 207b.

In the aforementioned manufacturing method, as the lower surfaces 227 of the intermediate portions 211a are subjected to absorption, it is unnecessary to use metal molds for sandwiching the lead frame 210, wherein it is possible to easily incline the stages 202. This reduces the space required for manufacturing; and it is possible to easily produce the magnetic sensor 201 in a short period of time.

The conventionally-known technology may use a pair of upper and lower metal molds that hold a lead frame vertically so as to incline stages, wherein it may be difficult to adopt the aforementioned MAP method. The upper and lower metal molds may require extraction slopes allowing exterior mold packages to be extracted therefrom. This forms a limitation in reducing the overall area of the bottom 207b of the exterior mold package 207. In contrast, as the present embodiment can easily incline the stages 202 without using the upper and lower metal molds, it is possible to adopt the MAP method, which may eliminate the necessity of forming extraction slopes. Therefore, it is possible to reduce the overall area of the bottom 207b of the exterior mold package 207; and it is possible to easily realize downsizing of the magnetic sensor 201.

By using the magnetic sensor chips 203 for detecting geomagnetic factors, it is possible to calculate vectors representing the geomagnetic direction in a three-dimensional space; hence, the geomagnetic bearing can be displayed on a display panel of a portable terminal device (not shown) incorporating the magnetic sensor 201. This makes it possible to additionally provide various navigation functions using geomagnetism with portable terminal devices.

In the present embodiment, a pair of the projections 215 are formed at both ends of the opposite ends 202c of the stage 202, which is not a restriction. Of course, it is possible to appropriately change the number of projections and forming positions of projections in relation to stages.

The magnetic sensor chip 203 is mounted on the upper surface 202a of the stage 202, which is not a restriction. That is, the magnetic sensor chip 203 can be attached to the lower surface of a back side 202d of the stage 202. This makes it easy to electrically connect the leads 205 to the magnetic sensor chip 203 without causing interference between the projections 215 and the wires 204.

The present embodiment uses the absorption holes 222 and absorption devices 223, which is not a restriction. That is, it is possible to use other absorption means having appropriate structures. For example, it is possible to use magnetic force (or magnetic attraction) realized by magnets, which are attached to the base 217. Herein, it is possible to use permanent magnets or electromagnets. Electromagnets may be advantageous because it is possible to easily adjust the absorption timing and absorption force; in addition, they make it easy to remove the lead frame 210 and magnetic sensor 201 from the base 217 by breaking electrification therefor.

In the inclination step, the intermediate portions 211a are closely attached to the planar surface 218, which is not a restriction. That is, the intermediate portions 211a can be maintained in a floating state above the planar surface 218.

Figure 26:
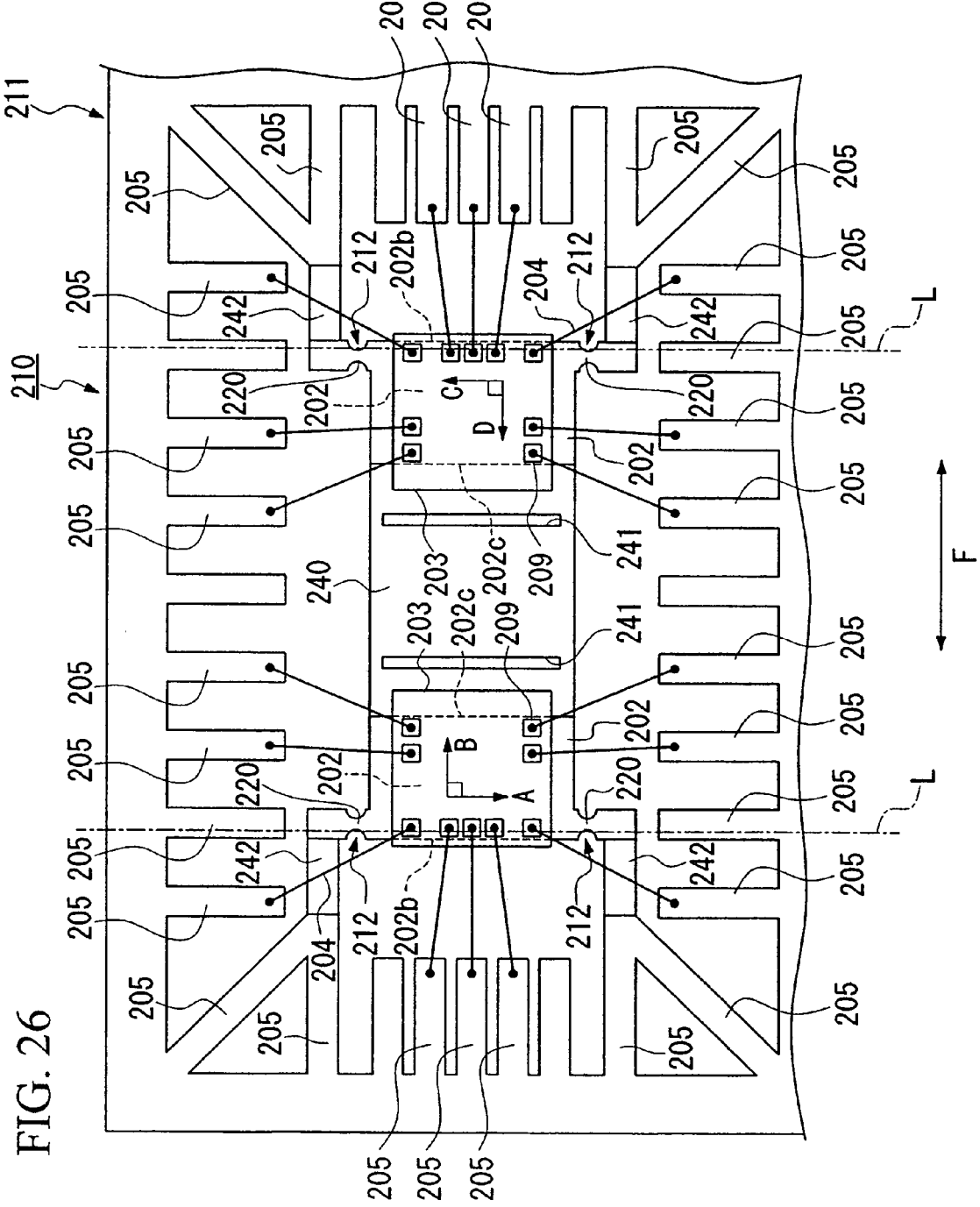
FIG. 26 is a plan view showing a modification of the lead frame of FIG. 20 in which projections are replaced with slits.

It is possible to appropriately change the design and shape of the lead frame 210. For example, the lead frame 210 can be modified as shown in FIG. 26 in which the foregoing projections 215 are eliminated but a stage interconnection portion 240 is provided so as to integrally interconnect the stages 202 together. In addition, slits 241 each elongated in a direction perpendicular to the longitudinal direction F are formed at both sides of the stage interconnection portion 240. The slits 241 can be replaced with thinned portions whose thickness is reduced compared with other portions of the stage interconnection portion 240. Furthermore, lead inclination portions 242, which are inclined upwardly, are formed in the prescribed leads 205 that are connected to the stages via the interconnection portions 212, wherein the stages 202 are each positioned upwardly with prescribed offset values.

Figure 27:
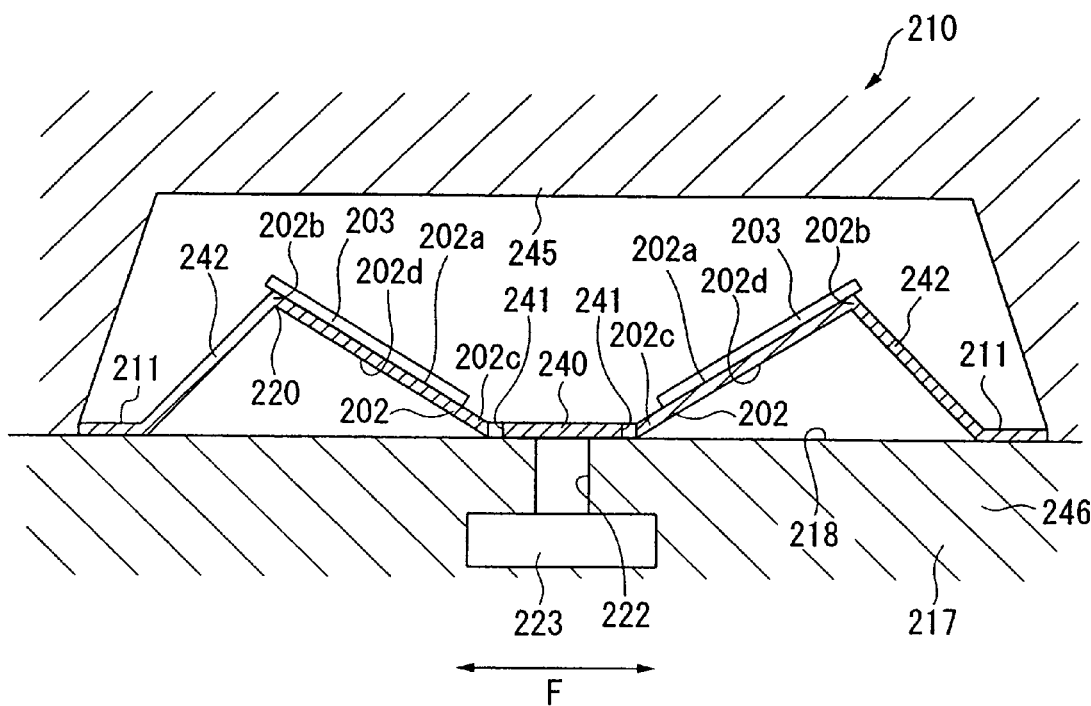
FIG. 27 is a cross-sectional view showing essential parts of the lead frame shown in FIG. 26, which is placed between upper and lower molds so as to incline stages.

The aforementioned lead frame 210 is placed at a prescribed position of a lower mold 246 as shown in FIG. 27, wherein it is sandwiched between the lower mold 46 and an upper mold 45; then, the absorption device 223 is driven so as to absorb the stage interconnection portion 240 formed in proximity to the stages 202. That is, the opposite ends 202c of the stages 202 are lowered so that the stages 202 are correspondingly inclined. Due to the absorption effected on the stage interconnection portion 240, the opposite ends 202c of the stages 202 are rotatably bent about axial lines running through the slits 241, so that the stages 202 are gradually inclined while the bases of the lead inclination portions 240 and the twisting portions 220 are bent; hence, the stage interconnection portion 240 is closely attached onto the planar plane 218. Thereafter, molding is performed by introducing a resin into a cavity between the upper mold 45 and the lower mold 46, which hold the lead frame 210 therebetween such that the stage interconnection portion 240 is closely attached onto the planar surface 218.

As described above, even though the upper mold 45 and the lower mold 46 are used, it is unnecessary to press selected positions of the lead frame 210 during the inclination step of the stages 202. That is, it is possible to reliably prevent the upper mold 45 and the lower mold 46 from being damaged; hence, it is possible to improve the durability of the upper mold 45 and the lower mold 46.

Of course, the magnetic sensor 201 can be reliably produced by way of the aforementioned MAP method without using the upper mold 45 and the lower mold 46.

The present embodiment can be further modified in various ways, which will be described below.

(1) First Modification

Figure 28:
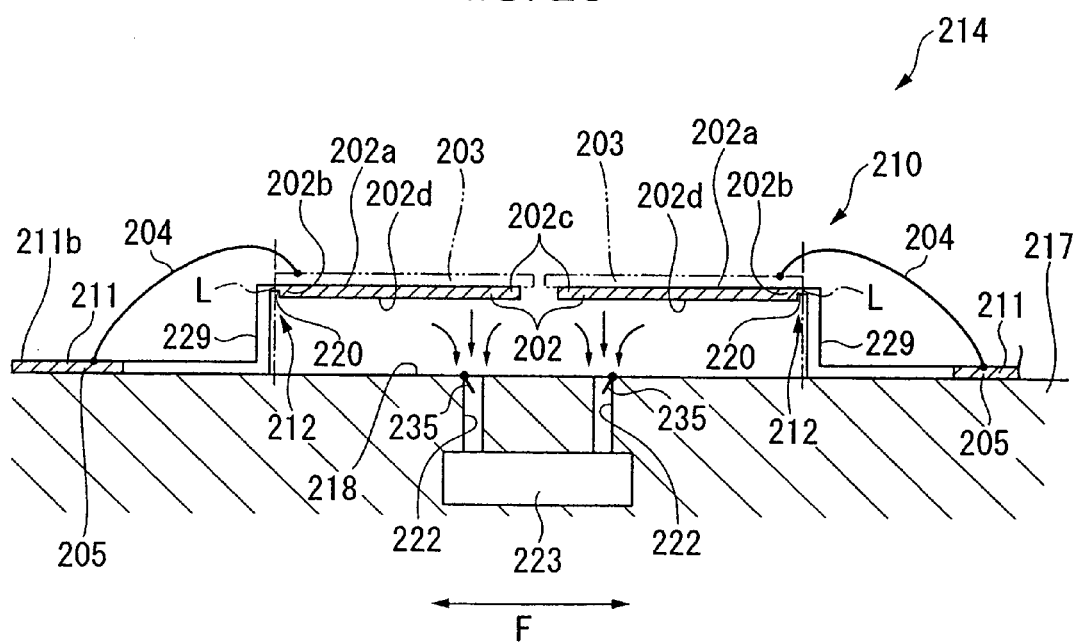
FIG. 28 is a side view showing essential parts of a lead frame included in a thin metal plate in accordance with a first modification of the second embodiment.
Figure 29:
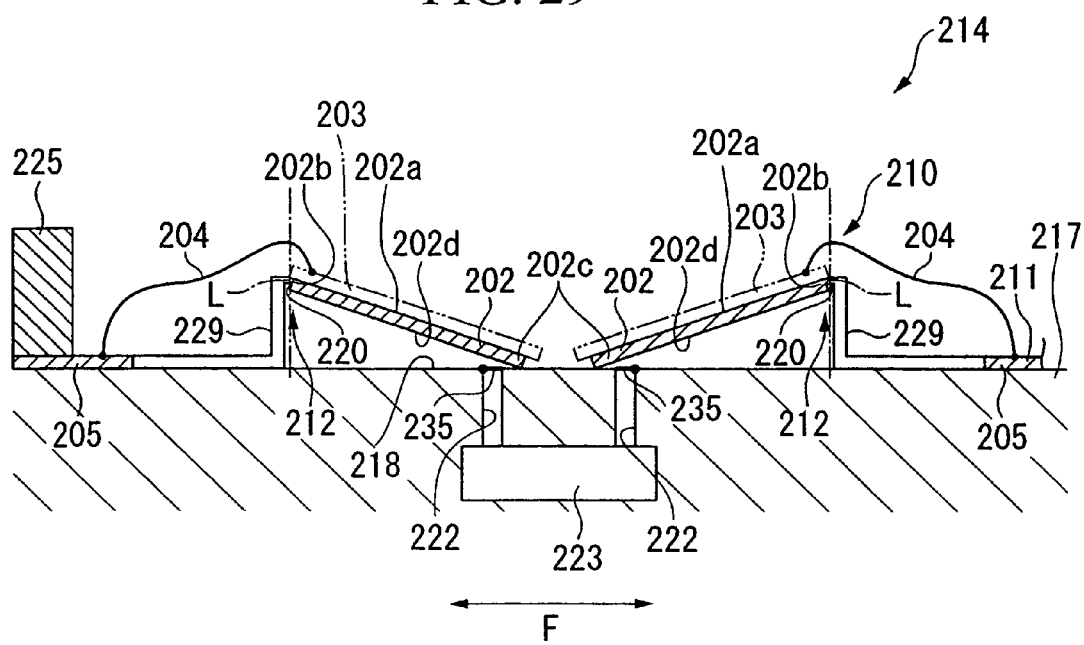
FIG. 29 is a side view showing that due to absorption caused by an absorption device, stages of the lead frame shown in FIG. 28 are inclined with respect to a base.

FIGS. 28 and 29 show essential parts of the thin metal plate 214 realizing the lead frame 210 in accordance with a first modification of the present embodiment, wherein parts identical to those shown in FIGS. 19 to 25 are designated by the same reference numerals; hence, the detailed description thereof will be omitted.

The first modification is basically similar to the present embodiment in terms of steps in manufacturing, wherein the following description will be given with respect to differences therebetween.

That is, the bases 202b of the stages 202 are interconnected to upper ends of support walls 229 that vertically stand on the base 217, whereby the lead frame 210 is positionally lifted up with prescribed offset values. Such a lead frame 210 is formed in the thin metal plate 214 in a frame forming step.

In addition, the absorption device 213 is connected with the absorption holes 222 having openings, which are equipped with covers 235. The covers 235 are hinged to the openings of the absorption holes 222 and are rotatably supported by hinges so as to open and close the openings of the absorption holes 222. Specifically, the free end of the cover 235 moves between a close position at which it closes the opening of the absorption hole 222 and an open position at which it is retracted inside of the absorption hole 222 so as to realize the opening of the absorption hole 222. Each of the covers 235 is normally positioned at the close position by being pressed by an elastic member (not shown). The aforementioned absorption holes 222 are arranged to positionally match the opposite ends 202c of the stages 202. When the thin metal plate 214 is placed at a prescribed position of the base 217, the absorption holes 222 are arranged opposite to the opposite ends 202c of the stages 202 respectively.

After completion of the installation step that is described in the aforementioned embodiment, the absorption device 223 is driven so as to produce an absorption force, by which the covers 235 are each forced to move to the open position irrespective of the operation of the elastic members therefor, whereby the absorption holes 222 are opened so as to attract the lower surfaces 202d of the stages 202 thereby.

In the above, due to pressure differences occurring in the absorption holes 222, as shown in FIG. 29, the opposite ends 202c of the stages 202 are subjected to absorption via the absorption holes 222 by means of the absorption device 223, wherein the stages 202 mutually rotate about axial lines L so that the opposite ends 202c are gradually lowered while the twisting portions 220 are being twisted. As a result, all the stages 202 included in the thin metal plate 214 are inclined with respect to the frame portion 211, thus completing an inclination step.

Thereafter, similar to the aforementioned embodiment, a molding step and a dicing step are performed, thus producing a magnetic sensor 201 having the lead frame 210 of the first modification of the present embodiment.

As described above, it is possible to reliably incline the stages 202 with a simple structure.

(2) Second Modification

Figure 30:
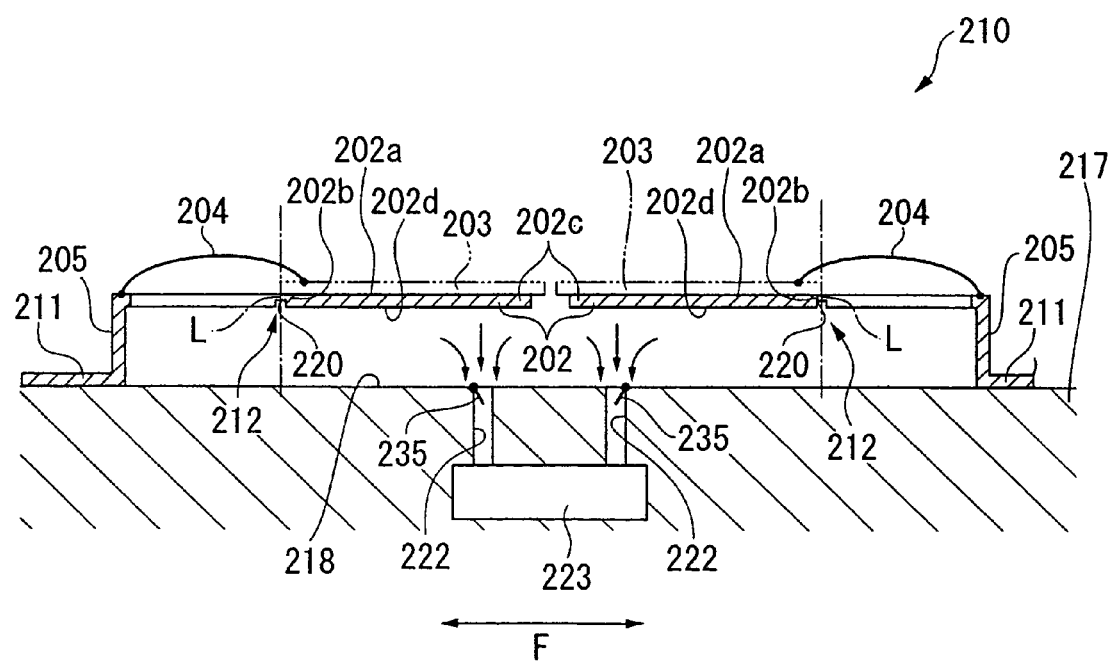
FIG. 30 is a side view showing essential parts of a lead frame in accordance with a second modification of the second embodiment.
Figure 31:
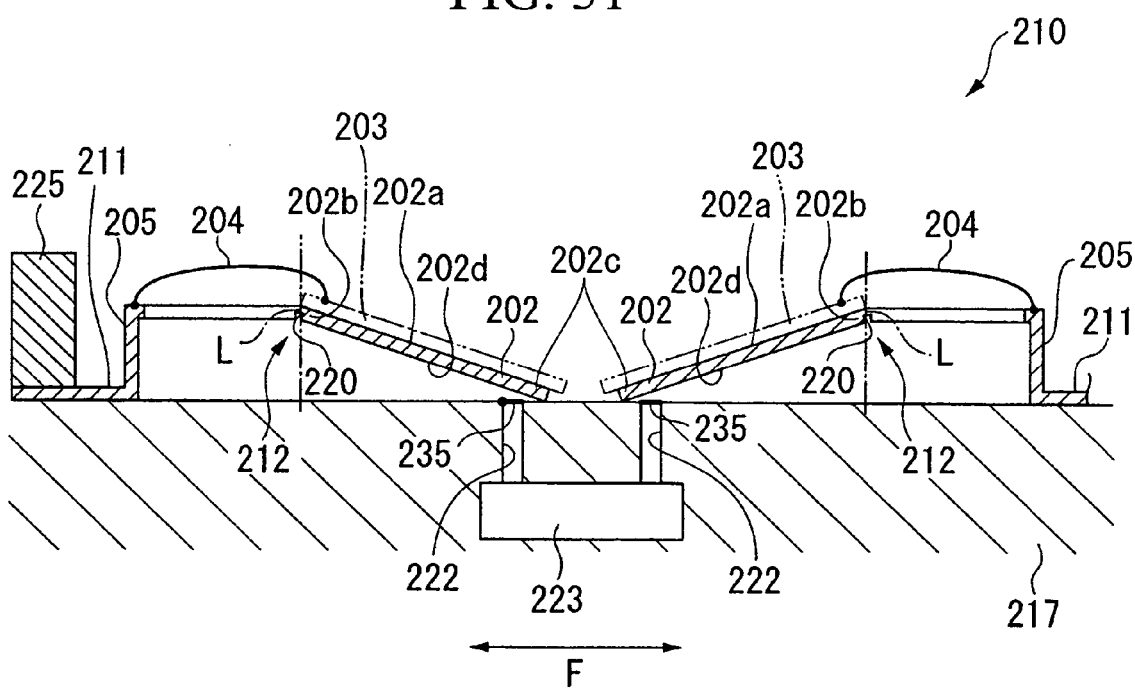
FIG. 31 is a side view showing that due to absorption caused by an absorption device, stages of the lead frame shown in FIG. 30 are inclined with respect to a base.

FIGS. 30 and 31 show essential parts of the lead frame 210 in accordance with a second modification of the present embodiment, wherein parts identical to those shown in FIGS. 19 to 25 are designated by the same reference numerals; hence, the detailed description thereof will be omitted.

In the second modification, the leads 205 are each bent in an L-shape and partially project upwardly from the frame portion 211. Upper ends of the leads 205 are respectively connected to the bases 202b of the stages 202 via interconnection portions 212, which are each elongated in a longitudinal direction F. Thus, the stages 202 are each lifted up above the frame portion 211 with prescribed offset values.

The aforementioned lead frame 210 is formed in a frame forming step; then, the aforementioned steps are performed so as to produce a magnetic sensor 201 having the lead frame 210 of the second modification.

The second modification can demonstrate prescribed effects similar to those of the aforementioned embodiments. In addition, the second modification is advantageous in that the upper surfaces of the magnetic sensor chips 203 substantially match the surfaces of the leads 205 in height. This makes it easy to electrically connect the leads 205 to the magnetic sensor chips 203. Furthermore, the second modification can reduce the lengths of the wires 204 and can also reduce variations of the wires 204 during the inclination of the magnetic sensor chips 203. Thus, it is possible to improve the reliability in producing the magnetic sensor 201.

(3) Third Modification

Figure 32:
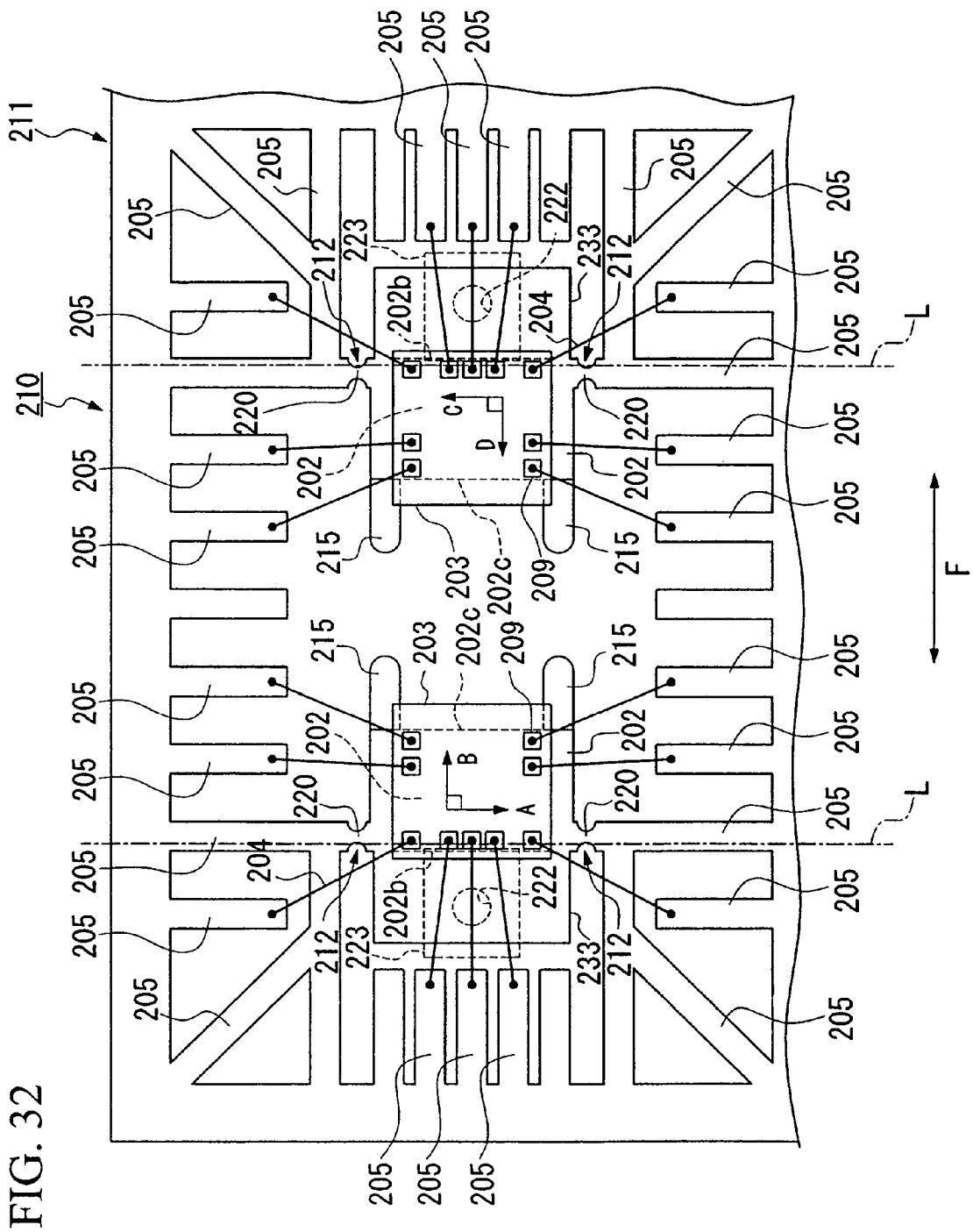
FIG. 32 is a plan view showing the structure of a lead frame having inclination portions in accordance with a third modification of the second embodiment.
Figure 33:
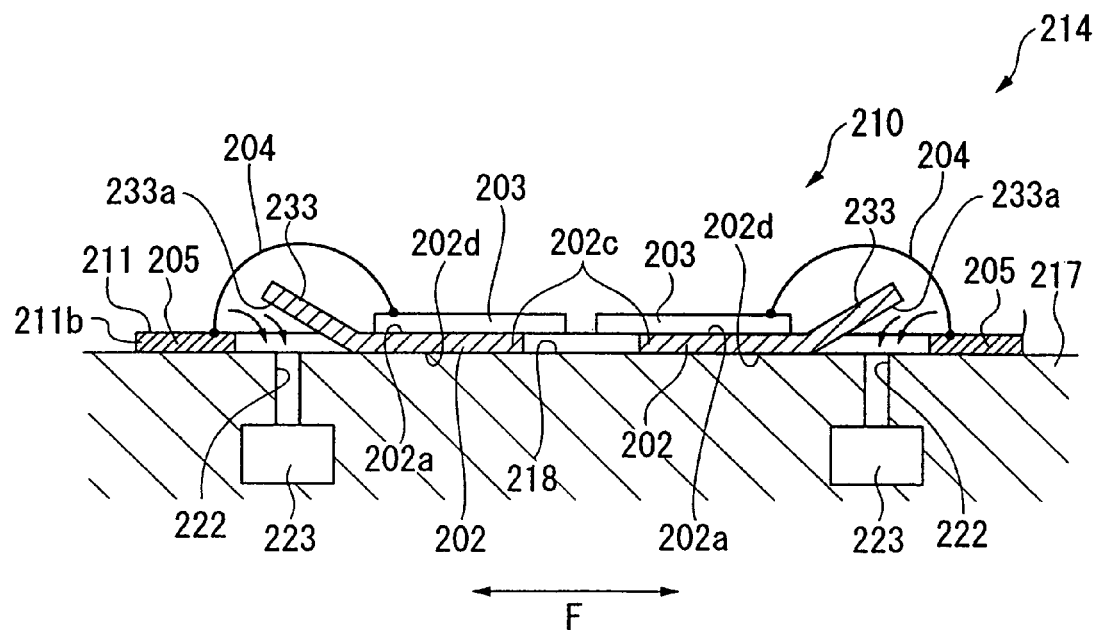
FIG. 33 is a side view showing that inclination portions of the lead frame are subjected to absorption by way of absorption devices via absorption holes on a base.
Figure 34:
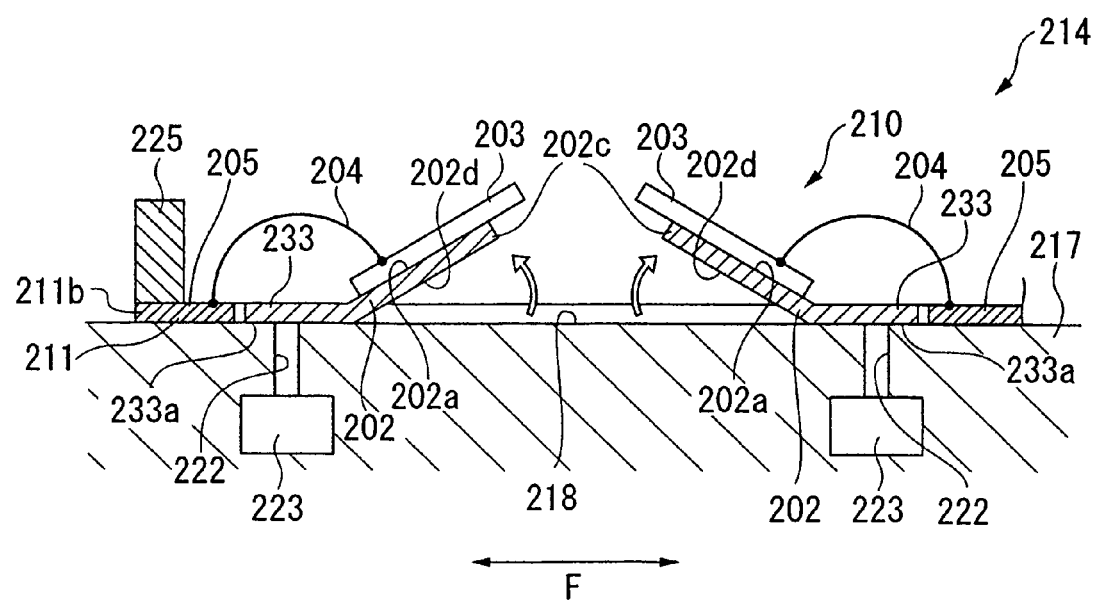
FIG. 34 is a side view showing that due to absorption of the inclination portions, stages of the lead frame shown in FIG. 33 are lifted up and thus inclined with respect to the base.

FIGS. 32 to 34 show essential parts of the lead frame 210 in accordance with a third modification of the present embodiment, wherein parts identical to those shown in FIGS. 19 to 25 are designated by the same reference numerals; hence, the detailed description thereof will be omitted.

In the third modification, as shown in FIGS. 32 and 33, inclination portions 233 are formed at the bases 202b of the stages 202 and are extended outwardly in a slanted manner towards the upper surfaces 202a of the stages 202. The lead frame 210 having the inclination portions 233 is formed in a frame forming step.

In the above, the absorption holes 222 of the base 217 are arranged to positionally match the inclination portions 233. When the thin metal plate 214 realizing the lead frame 210 shown in FIG. 32 is placed at a prescribed position of the base 217, the inclination portions 233 of the lead frame 210 are arranged opposite to the absorption holes 222 on the base 217.

Similar to the aforementioned embodiment, after completion of an installation step, when the absorption devices 223 are driven, lower surfaces 233a of the inclination portions 233 are subjected to absorption via the absorption holes 222. That is, as shown in FIG. 34, as the inclination portions 233 are absorbed by the absorption holes 222, the stages 202 mutually rotate so that the opposite ends 202c are gradually lowered while the twisting portions 220 are being twisted. When the inclination portions 233 are closely attached onto the planar plane 218, they are arranged substantially in the same plane as the frame portion 211. Thus, all the stages 202 included in the thin metal plate 214 are inclined with respect to the frame portion 211 as the opposite ends 202c are lifted up, thus realizing an inclination step.

Thereafter, the aforementioned molding step and dicing step are performed so as to produce a magnetic sensor 201 having the lead frame 210 shown in FIG. 32.

Thus, it is possible to reliably incline the stages 202 with a simple structure.

Incidentally, the second embodiment and its modifications are all described in relation to the MAP method, which is not a restriction. That is, the lead frame 210 can be subjected to molding using upper and lower molds.

In addition, the second embodiment and its modifications are all described in connection with the magnetic sensor 201, which is not a restriction. That is, they can be easily adapted to other types of physical quantity sensors such as acceleration sensors.

3. Third Embodiment

Next, a manufacturing method for a physical quantity sensor according to a third embodiment of the present invention will be described. The third embodiment is basically similar to the second embodiment, which is described in conjunction with FIGS. 19 to 34; hence, the detailed description thereof will be omitted.

Figure 35:
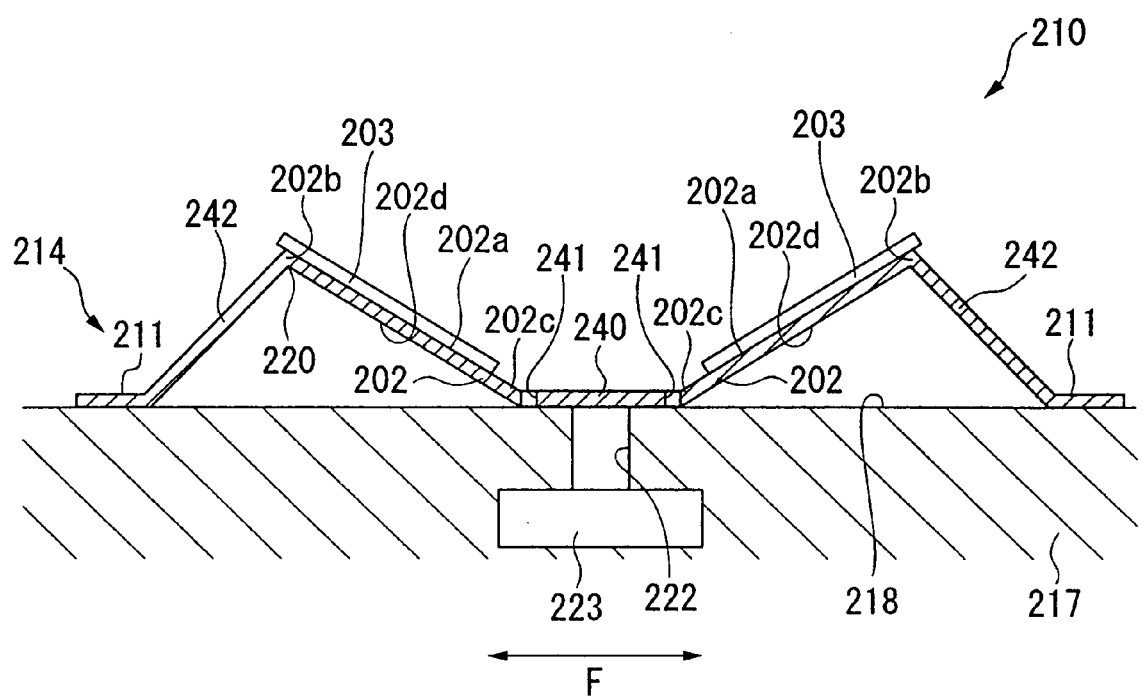
FIG. 35 is a side view showing essential parts of a lead frame for use in a magnetic sensor, which is manufactured in accordance with a third embodiment of the present invention.

The magnetic sensor 201 according to the third embodiment is manufactured without using metal molds, wherein after completion of the connection step, the thin metal plate 214 is fixed at a prescribed position on the base 217, so that as shown in FIG. 35 (which basically corresponds to FIG. 27), the stage interconnection portion 240 is positioned oppositely to the absorption hole 222 in an installation-fixation step. Then, the absorption device 223 is driven so as to absorb the stage interconnection portion 240 formed in proximity to the stages 202, which are thus gradually inclined as the opposite ends 202c are lowered, thus realizing an inclination step. Specifically, when the stage interconnection portion 240 is subjected to absorption, the opposite ends 202c of the stages 202 are respectively bent about axial lines running through the slits 241, wherein the stages 202 are inclined as the bases of the lead inclination portions 242 and the twisting portions 220 are being bent, so that the stage interconnection portion 240 is brought into close contact with the planar surface 218. In such a close contact state, a resin is introduced so as to mold an exterior mold package in a molding step. Thus, similar to the second embodiment, it is possible to produce the magnetic sensor 201 in accordance with the third embodiment, which is advantageous because the stages 202 can be reliably and speedily inclined.

Figure 36:
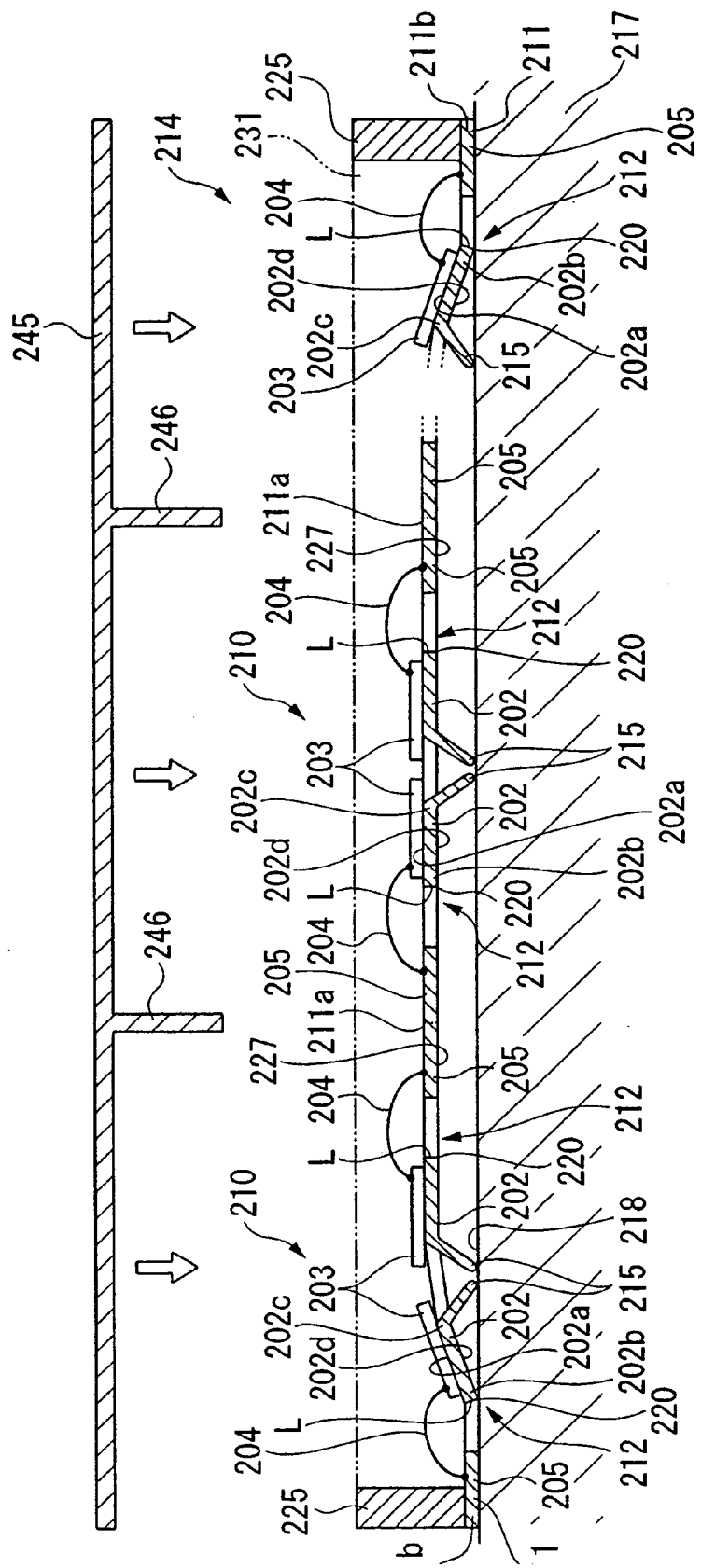
FIG. 36 is a cross-sectional view showing essential parts of the magnetic sensor, which is placed on a base associated with a support frame having pressing pins.
Figure 37:
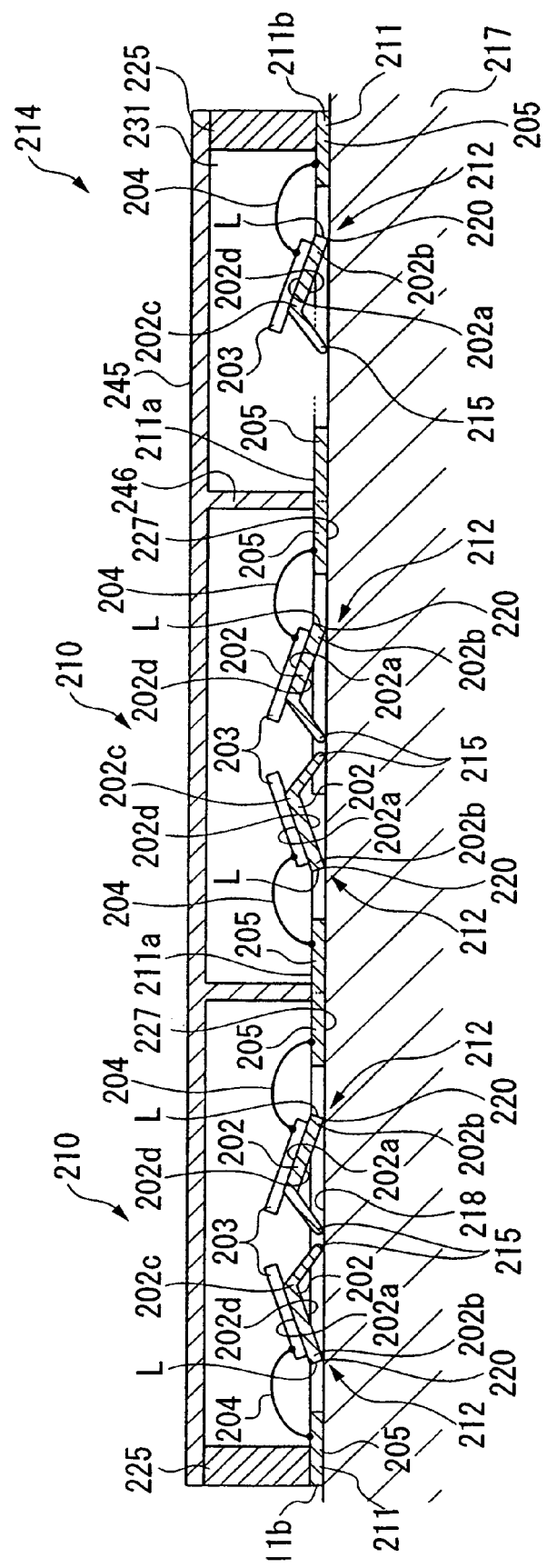
FIG. 37 is a cross-sectional view showing essential parts of the magnetic sensor, which is clamped on the base and is assembled together with the support frame.

FIGS. 36 and 37 show a modification of the magnetic sensor 201, wherein parts identical to those used in the second embodiment are designated by the same reference numerals; hence, the detailed description thereof will be omitted.

In the installation-fixation step, the thin metal plate 214 is fixed onto the base 217; then, it is subjected to pressing by means of a plurality of pressing pins 246 in a direction perpendicular to the planar surface 218.

Each of the pressing pins 246 is elongated in a columnar manner. The pressing pins 246 are supported by a support frame 245 having a rectangular lattice-like shape. When the support frame 245 from which the pressing pins 246 project downwardly is placed above the base 217, the pressing pins 246 are positioned opposite to intersecting points between the intermediate portions 211a, which are formed in a matrix form on the thin metal plate 214.

Specifically, after the thin metal plate 214 is fixed onto the base 217 in the installation-fixation step, the support frame 245 is moved above the thin metal plate 214 such that the pressing pins 246 are each positioned precisely above the intersecting points between the intermediate portions 211a; then, the support frame 245 is moved downwardly towards the base 217. At the prescribed timing, the tip ends of the pressing pins 246 are brought into contact with the intersecting points between the intermediate portions 211a, which are thus pressed downwardly. By further moving down the support frame 245, the intermediate portions 211a are lowered in position towards the planar surface 218. Thus, as shown in FIG. 37, the stages 202 mutually rotate about the axial lines L as the opposite ends 202c thereof are slightly lifted up while the twisting portions 220 are being twisted. When the support frame 245 is fixed at a prescribed position in connection with the clamp 225, the intermediate portions 211a are brought into close contact with the planar surface 218, so that the stages 202 are inclined with respect to the frame portion 211, thus realizing an inclination step.

In such an inclined state, a resin is introduced into the space, which is defined by the base 217, clamp 225, and support frame 245, so as to mold an exterior mold package in a molding step. Thereafter, the support frame 245 is removed. Thus, similar to the second embodiment, a dicing step is performed so as to produce the magnetic sensor 201 in accordance with the third embodiment.

In the above, the stages 202 can be reliably and speedily inclined by use of a simple structure for manufacturing.

Incidentally, the support frame 245 is not necessarily formed in a rectangular lattice-like shape. For example, it can be formed like a flat plate. That is, the support frame 245 can be appropriately changed in shape and size.

The third embodiment uses the pressing pins 246 that press the intersecting points between the intermediate portions 211a, which is not a restriction. That is, it is possible to use appropriately designed pressing means; and it is possible to change pressed positions of the thin metal plate 214. For example, pressing is performed at prescribed positions which are disposed along the whole lengths of the intermediate portions 211a with prescribed distances therebetween.

Of course, the third embodiment is not necessarily limited to the magnetic sensor 201; hence, it can be applied to other types of physical quantity sensors such as acceleration sensors.

Lastly, the present invention is not necessarily limited to the aforementioned embodiments, hence, it is possible to realize various design changes and modifications within the scope of the invention defined by the appended claims.

What is claimed is:

1. A manufacturing method for a physical quantity sensor, comprising:
    forming a lead frame having a plurality of stages, a frame portion having a plurality of leads that are formed to encompass the stages, and a plurality of interconnection portions for interconnecting prescribed ends of the stages to the frame portion;
    bonding a plurality of physical quantity sensor chips onto the stages of the lead frame;
    electrically connecting the leads to the physical quantity sensor chips;
    placing the lead frame onto a planar surface of a base; and
    absorbing prescribed portions related to the stages of the lead frame onto the base, wherein due to absorption, the stages mutually rotate about axial lines while the interconnection portions are being bent, so that the stages are inclined with respect to the frame portion.

2. The manufacturing method for a physical quantity sensor according to claim 1, wherein the prescribed portions correspond to intermediate portions formed between the stages and are subjected to absorption by way of absorption holes connected with absorption devices in the base.

3. The manufacturing method for a physical quantity sensor according to claim 1 further comprising:
    fixing a periphery of a thin metal plate having the frame portion encompassing a plurality of lead frames by means of a clamp that vertically stands on the planar plane of the base;
    injecting a resin into a space holding the thin metal plate, which is defined by the planar plane and the clamp, so as to simultaneously mold exterior mold packages respectively encapsulating the lead frames; and
    subjecting the frame portion to dicing so as to isolate individual units of the exterior mold packages.

4. The manufacturing method for a physical quantity sensor according to claim 1, wherein a plurality of projections project downwardly from the stages, so that due to absorption of the prescribed portions, which match a lower surface of the frame portion in proximity to the stages, the projections are subjected to pressing so that prescribed ends of the stages are pressed upwardly.

5. The manufacturing method for a physical quantity sensor according to claim 1, wherein the stages are lifted upwards from the frame portion with prescribed offset values, so that due to absorption of the prescribed portions, prescribed ends of the stages are lowered downwards.

6. The manufacturing method for a physical quantity sensor according to claim 1, wherein a plurality of inclination portions are each extended upwardly from the stages in a slanted manner, so that the inclination portions are subjected to absorption and are lowered so as to lift up prescribed ends of the stages.

7. A manufacturing method for a physical quantity sensor using a lead frame that includes a plurality of stages for mounting physical quantity sensor chips thereon, a frame portion having a plurality of leads encompassing the stages, and a plurality of interconnection portions for interconnecting prescribed ends of the stages to the frame portion, said manufacturing method comprising:
    forming a plurality of lead frames in a thin metal plate;
    bonding the physical quantity sensor chips on the stages in each of the lead frames;
    electrically connecting the leads to the physical quantity sensor chips;
    placing the thin metal plate on a planar surface of a base;
    clamping a periphery of the thin metal plate by use of a clamp that vertically stands on the planar surface of the base;
    pressing prescribed portions in proximity to the stages in a direction perpendicular to the planar surface so as to incline the stages with respect to the frame portion while the interconnection portions are being bent about axial lines, wherein the physical quantity sensor chips overlap at least some of the leads in the perpendicular direction;
    introducing a resin into a space defined by the clamp and the planar surface of the base so as to mold a package encapsulating the lead frame in which the stages are mutually inclined with respect to each other; and
    dicing the frame portion and the package.

8. The manufacturing method for a physical quantity sensor according to claim 7, wherein pressing pins are used to press the prescribed portions in proximity to the stages in the direction perpendicular to the planar surface so as to incline the stages with respect to the frame portion.

9. The manufacturing method for a physical quantity sensor according to claim 7 further comprising:
    absorbing the prescribed portions formed in proximity to the stages in a direction towards the planar surface, wherein projections projecting from the stages are subjected to pressing by the planar surface due to absorption, so that opposite ends of the stages are moved oppositely to the planar surface, thus inclining the stages with respect to each other.

10. The manufacturing method for a physical quantity sensor according to claim 7 further comprising:
    absorbing the prescribed portions formed in proximity to the stages in the direction towards the planar surface, wherein the stages are initially positioned apart from the planar surface of the base with prescribed offset values, so that opposite ends of the stages are moved towards the planar surface due to absorption, thus inclining the stages with respect to each other.

11. The manufacturing method for a physical quantity sensor according to claim 7 further comprising the step of:
absorbing the prescribed portions formed in proximity to the stages in the direction towards the planar surface, wherein inclination portions extending from the stages are inclined due to absorption, thus inclining the stages with respect to each other.

12. The manufacturing method for a physical quantity sensor according to claim 2, wherein a plurality of projections project downwardly from the stages, so that due to absorption of the prescribed portions, which match a lower surface of the frame portion in proximity to the stages, the projections are subjected to pressing so that prescribed ends of the stages are pressed upwardly.

13. The manufacturing method for a physical quantity sensor according to claim 3, wherein a plurality of projections project downwardly from the stages, so that due to absorption of the prescribed portions, which match a lower surface of the frame portion in proximity to the stages, the projections are subjected to pressing so that prescribed ends of the stages are pressed upwardly.

14. The manufacturing method for a physical quantity sensor according to claim 2, wherein the stages are lifted upwards from the frame portion with prescribed offset values, so that due to absorption of the prescribed portions, prescribed ends of the stages are lowered downwards.

15. The manufacturing method for physical quantity sensor according to claim 3, wherein the stages are lifted upwards from the frame portion with prescribed offset values, so that due to absorption of the prescribed portions, prescribed ends of the stages are lowered downwards.

16. The manufacturing method for physical quantity sensor according to claim 2, wherein a plurality of inclination portions are each extended upwardly from the stages in a slanted manner, so that the inclination portions are subjected to absorption and are lowered so as to lift up prescribed ends of the stages.

17. The manufacturing method for a physical quantity sensor according to claim 3, wherein a plurality of inclination portions are each extended upwardly from the stages in a slanted manner, so that the inclination portions are subjected to absorption and are lowered so as to lift up prescribed ends of the stages.

* * * * *